(12) United States Patent
Yoshida et al.

(10) Patent No.: US 9,755,548 B2
(45) Date of Patent: Sep. 5, 2017

(54) BOOTSTRAP COMPENSATION CIRCUIT AND POWER MODULE

(71) Applicant: Mitsubishi Electric Corporation, Tokyo (JP)

(72) Inventors: Hiroshi Yoshida, Fukuoka (JP); Kyoko Oyama, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/130,164

(22) Filed: Apr. 15, 2016

(65) Prior Publication Data
US 2017/0070220 A1 Mar. 9, 2017

(30) Foreign Application Priority Data
Sep. 9, 2015 (JP) .................................. 2015-177234

(51) Int. Cl.
| | |
|---|---|
| H02M 7/538 | (2007.01) |
| H02M 7/5387 | (2007.01) |
| H03K 17/06 | (2006.01) |
| H03K 17/691 | (2006.01) |

(52) U.S. Cl.
CPC ........ *H02M 7/5387* (2013.01); *H03K 17/063* (2013.01); *H03K 17/691* (2013.01); *H03K 2217/0063* (2013.01); *H03K 2217/0072* (2013.01); *H03K 2217/0081* (2013.01)

(58) Field of Classification Search
CPC ................................ H02M 3/06; H02M 7/537
See application file for complete search history.

(56) References Cited

U.S. PATENT DOCUMENTS

| | | | | |
|---|---|---|---|---|
| 8,724,357 B2 * | 5/2014 | Imanishi | ................. | H02M 1/08 323/271 |
| 9,270,177 B1 * | 2/2016 | Nakamura | ............. | H02M 3/158 |
| 9,570,927 B2 * | 2/2017 | Kinzer | .................. | H02J 7/0052 |
| 9,571,093 B2 * | 2/2017 | Kinzer | .................. | H03K 17/687 |
| 2005/0225259 A1 * | 10/2005 | Green | ................. | H02M 3/1588 315/224 |
| 2006/0273774 A1 * | 12/2006 | Galinski | ................ | H02M 3/156 323/288 |
| 2007/0097578 A1 * | 5/2007 | Bartolo | .................... | H02M 1/32 361/93.1 |
| 2007/0108952 A1 * | 5/2007 | Bartolo | ................. | H02M 3/157 323/282 |
| 2008/0197817 A1 * | 8/2008 | Colbeck | .............. | H02M 1/4225 323/205 |

(Continued)

FOREIGN PATENT DOCUMENTS

| | | |
|---|---|---|
| JP | 2011-234430 A | 11/2011 |
| JP | 2015-082810 A | 4/2015 |

*Primary Examiner* — Timothy J Dole
*Assistant Examiner* — Yusef Ahmed
(74) *Attorney, Agent, or Firm* — Studebaker & Brackett PC

(57) ABSTRACT

A bootstrap compensation circuit includes: a plurality of resistors series-connected between a floating potential corresponding to a high-voltage-side potential and a reference potential; a second capacitor that has one end connected to a divided potential extraction point and has the other end connected to the reference potential, the divided potential extraction point located between the plurality of resistors; and an output circuit which supplies current to a first capacitor, according to a potential of the divided potential extraction point.

9 Claims, 15 Drawing Sheets

(56) References Cited

U.S. PATENT DOCUMENTS

| | | | | |
|---|---|---|---|---|
| 2011/0199710 A1* | 8/2011 | Hano | ............... | H02M 1/08 361/92 |
| 2011/0260707 A1* | 10/2011 | Imanishi | ............... | H02M 1/08 323/311 |
| 2013/0063123 A1* | 3/2013 | Liang | ............... | H03K 17/687 323/313 |
| 2013/0070487 A1* | 3/2013 | Ozawa | ............... | H02M 1/36 363/21.17 |
| 2013/0127431 A1* | 5/2013 | Ansari | ............... | G05F 1/10 323/282 |
| 2015/0042298 A1* | 2/2015 | Kung | ............... | H02M 3/1588 323/271 |
| 2015/0115718 A1* | 4/2015 | Yoshida | ............... | H02M 3/06 307/63 |
| 2015/0311797 A1* | 10/2015 | Okamatsu | ............... | H02M 3/1582 323/271 |
| 2015/0357917 A1* | 12/2015 | Okamatsu | ............... | H02M 1/08 323/271 |
| 2016/0079785 A1* | 3/2016 | Kinzer | ............... | H02J 7/0052 320/107 |
| 2016/0079975 A1* | 3/2016 | Kinzer | ............... | H03K 17/687 327/109 |
| 2016/0079979 A1* | 3/2016 | Kinzer | ............... | H02J 7/0052 323/312 |
| 2016/0118894 A1* | 4/2016 | Zhang | ............... | H02M 3/158 323/271 |
| 2016/0336926 A1* | 11/2016 | Kinzer | ............... | H02J 7/0052 |
| 2017/0033677 A1* | 2/2017 | Wu | ............... | H02M 1/08 |

* cited by examiner

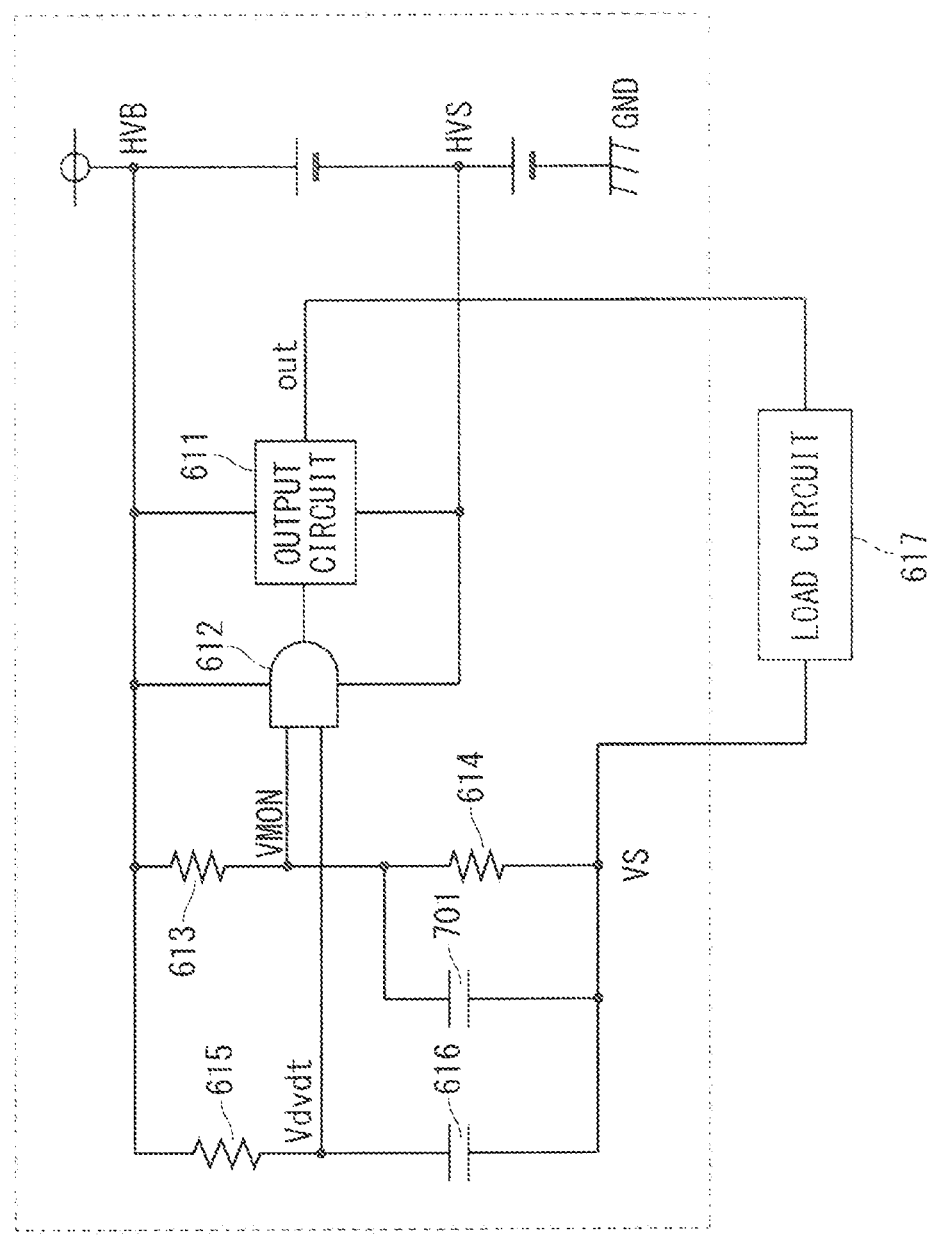
F I G. 1

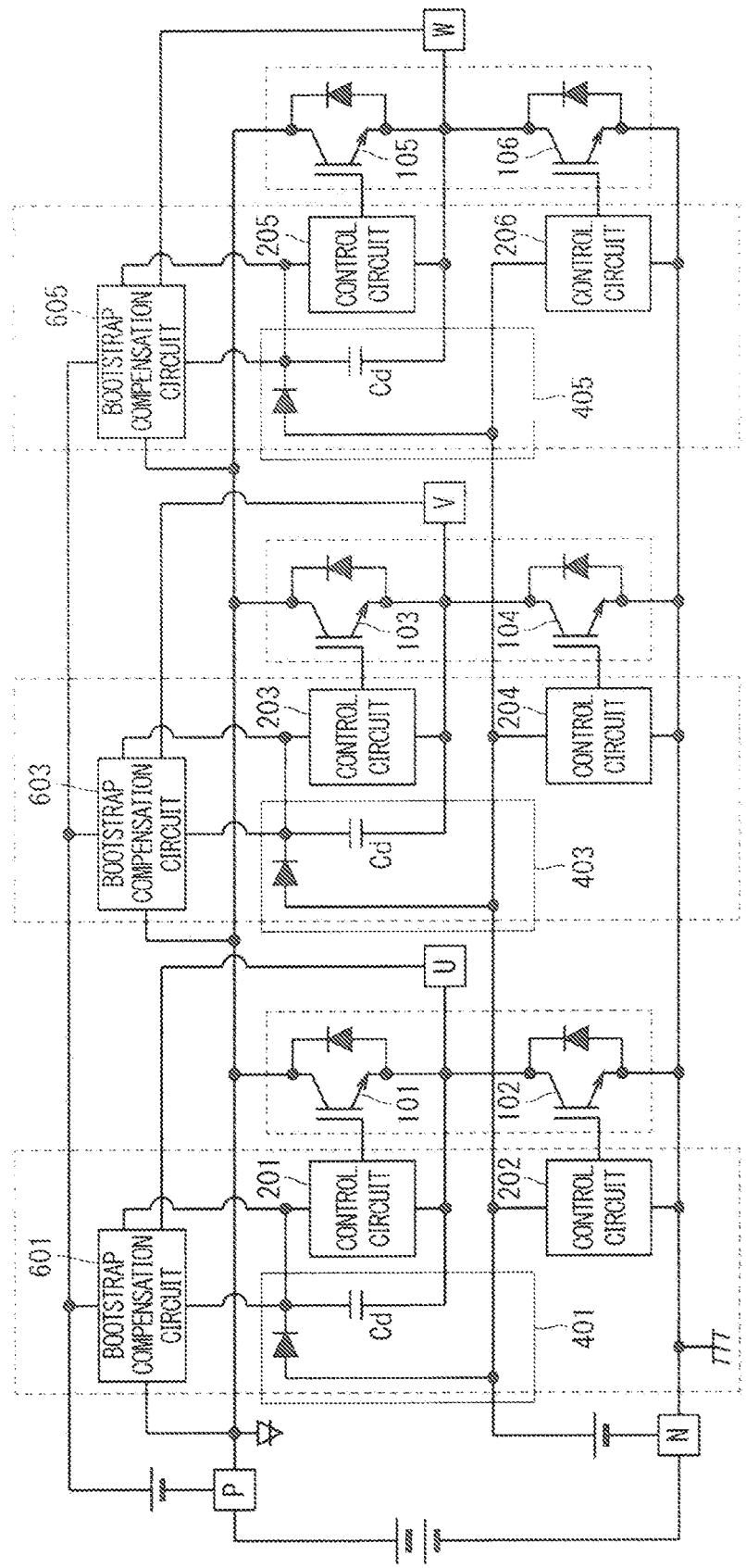
F I G. 11

BOOTSTRAP COMPENSATION CIRCUIT AND POWER MODULE

BACKGROUND OF THE INVENTION

Field of the Invention

The technology disclosed in the present specification relates to a bootstrap compensation circuit and a power module, in particular to a bootstrap compensation circuit which supplies current to a bootstrap circuit used to control a totem-pole connected high-side switching element, and relates to a power module including the bootstrap compensation circuit.

Description of the Background Art

Generally, in the case of a power device control circuit for driving each of totem-pole connected power devices such as an inverter circuit, an insulated individual power source needs to be used for each of a control circuit on a high side and a control circuit on a low side.

A power device control circuit for controlling a single-phase inverter needs to have totally three insulated power sources, that is, two insulated power sources on the high side and one insulated power source on the low side.

Further, a power device control circuit for controlling a three-phase inverter needs to have three insulated power sources on the high side, and hence needs to have totally four insulated power sources; thus, there is a problem that the size of the power device control circuit is increased.

On the other hand, in order to reduce the number of power sources, there is also a configuration in which bootstrap circuits are used as the power sources for the control circuits on the high side so that the number of power sources of the power device control circuit for controlling the three-phase inverter is reduced to one.

However, a bootstrap circuit cannot charge a capacitor when a power device on a high side is operating in an on-state. Therefore, when the power device on the high side operates in an on-state for a long time, a power source voltage goes down; therefore, it is difficult to apply a bootstrap circuit to a control method in which the power device operates in an on-state for a long time.

To address this issue, a bootstrap compensation circuit is proposed (see, for example, Japanese Patent Application Laid-Open No. 2011-234430) in order to make it possible to sufficiently charge a capacitor in a bootstrap circuit and to simplify and downsize the circuit.

However, in the case that a bootstrap compensation circuit as described in Japanese Patent Application Laid-Open No. 2011-234430 is used, the response speed is an issue to be addressed when taking into consideration a possible application of the bootstrap compensation circuit in which a high voltage such as 600 V or 1200 V is applied.

A resistive voltage divider circuit in a bootstrap compensation circuit needs to be provided between a high-voltage side of a power source voltage and a reference potential. Further, a resistive voltage divider circuit needs to have a resistor with a high resistance value in order to reduce current flowing through voltage dividing resistors.

As a result, a current consumption in the voltage dividing resistors is reduced, but at the same time a time constant of a CR circuit formed by the voltage dividing resistors and the accompanying parasitic capacitance is increased, whereby the response speed is lowered.

The output of the output circuit is switched from an on-state to an off-state due to the switching of the output of the resistive voltage divider circuit when the power source voltage becomes higher than the reference potential. However, because the output response of the resistive voltage divider circuit is slower than the change of the power source voltage, the switching of the output circuit between the on-state and the off-state is also delayed.

In the case that a load circuit of the output circuit is provided between the output circuit and the reference potential, an excessive electric power is applied to the load circuit and the output circuit since the power source voltage rises and until the output circuit goes into the off-state.

Alternatively, in order to address the above-described decrease in the response speed, there is a method in which a transient response signal is used to achieve a high-speed response. However, even in this case, the output circuit goes into the on-state after disappearance of the transient response signal which appears quickly but does not last long and until generation of a direct current signal which lasts long but is generated late, and an excessive electric power is also applied to the load circuit and the output circuit.

Note that an allowable power consumption is normally several hundreds of milliwatts or lower, considering a heat dissipation property of an IC package. In order to satisfy the above-described condition when a high voltage such as 600 V or 1200 V is applied, it is necessary to use voltage dividing resistors with resistances of meg-ohms.

If the parasitic capacitance accompanying the above-described voltage dividing resistors is several picofarads, the time constant is calculated by a formula (MΩ×several picofarads), and the response speed is in the order of a microsecond. On the other hand, the transient response between the power source voltage on the high-voltage side and the reference potential is in the order of several kilovolts per microsecond. As a result, before the response occurs in a period in the order of a microsecond and the output circuit goes into the off-state, an excessive electric power such as several tens of watts is applied to the load circuit and the output circuit.

SUMMARY OF THE INVENTION

The technology disclosed in the present specification relates to a bootstrap compensation circuit which can prevent or reduce decrease in a response speed, and relates to a power module including the bootstrap compensation circuit.

A bootstrap compensation circuit relating to an aspect of the technology disclosed in the present specification is a bootstrap compensation circuit which supplies current to a bootstrap circuit. The bootstrap circuit includes a first capacitor connected between a reference potential, which is a connection point between a high-side switching element and a low-side switching element, and a high-side control circuit so as to supply voltage to the high-side control circuit of the high-side control circuit and a low-side control circuit which control driving of the high-side switching element and the low-side switching element, respectively, where the switching elements are totem-pole connected, in order from a high voltage side, between a high-voltage-side potential and a low-voltage-side potential. The bootstrap compensation circuit includes: a plurality of resistors series-connected between a floating potential corresponding to the high-voltage-side potential and the reference potential; a second capacitor one end of which is connected to a divided potential extraction point and the other end of which is connected to the reference potential, the divided potential extraction point being a point between the plurality of resistors; and an output circuit which supplies current to the first capacitor, based on a potential of the divided potential extraction point.

A power module relating to an aspect of the technology disclosed in the present specification includes the above-described bootstrap compensation circuit, the high-side switching element, the low-side switching element, the high-side control circuit, the low-side control circuit, and the bootstrap circuit.

Further, a bootstrap compensation circuit relating to another aspect of the technology disclosed in the present specification is a bootstrap compensation circuit which supplies current to a bootstrap circuit. The bootstrap circuit includes a first capacitor connected between a reference potential, which is a connection point between a high-side switching element and a low-side switching element, and a high-side control circuit so as to supply voltage to the high-side control circuit of the high-side control circuit and a low-side control circuit which control driving of the high-side switching element and the low-side switching element, respectively, where the switching elements are totem-pole connected, in order from a high voltage side, between a high-voltage-side potential and a low-voltage-side potential. The bootstrap compensation circuit includes: a plurality of first resistors series-connected between a floating potential corresponding to the high-voltage-side potential and the reference potential; a first MOSFET whose drain is connected to a divided potential extraction point and whose source and gate are connected to the reference potential, the divided potential extraction point being a point between the plurality of first resistors; and an output circuit which supplies current to the first capacitor, based on a potential of the divided potential extraction point.

A power module relating to another aspect of the technology disclosed in the present specification includes the above-described bootstrap compensation circuit, the high-side switching element, the low-side switching element, the high-side control circuit, the low-side control circuit, and the bootstrap circuit.

Since the second capacitor is provided between the reference potential and the divided potential extraction point, the potential on the divided potential extraction point is capacitively coupled to the reference potential. With this arrangement, since the potential on the divided potential extraction point tries to keep a potential relation with the reference potential, the potential on the divided potential extraction point is less likely to follow the floating potential or the high-voltage-side potential. Thus, even in the case that a bootstrap compensation circuit for supplying current to the bootstrap circuit is included, it is possible to prevent or reduce the decrease in the response speed.

Further, since the bootstrap circuit is used, it is possible to reduce the number of insulated power sources. For example, in the case of a single-phase inverter, conventionally necessary three insulated power sources can be reduced to two insulated power sources. Further, for example, in the case of a three-phase inverter, conventionally necessary four insulated power sources can be reduced to two insulated power sources.

Further, it is possible to divert, as a capacitor, a structure formed as an element having a high source-drain breakdown voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram exemplifying a bootstrap compensation circuit relating to a preferred embodiment;

FIG. 11 is a diagram exemplifying a power device control circuit which controls a three-phase inverter relating to a preferred embodiment;

DESCRIPTION OF THE PREFERRED EMBODIMENTS

Figure 2:
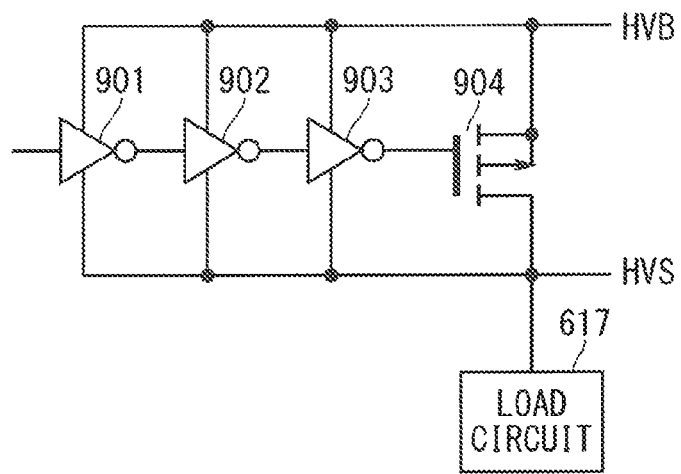
FIG. 2 is a diagram exemplifying an aspect of connection between an output circuit and a load circuit relating to a preferred embodiment.

Hereinafter, a preferred embodiment will be described with reference to the accompanying drawings. Note that the drawings are schematically shown, and the mutual relationships between the sizes and the positions of the images shown in different drawings are not necessarily accurately drawn and can be appropriately changed. Further, in the description shown below, the same structural elements are assigned the same reference numerals and have the same names and functions. Therefore, such structural elements are not described in detail in some cases.

First Preferred Embodiment

Hereinafter, a bootstrap compensation circuit and a power module relating to the present preferred embodiment will be described. For the sake of convenience of description, a power device control circuit for driving each of totem-pole connected power devices such as an inverter circuit will be described.

Generally, in the case of a power device control circuit for driving each of totem-pole connected power devices such as an inverter circuit, an insulated individual power source needs to be used for each of a control circuit on a high side and a control circuit on a low side.

Figure 12:
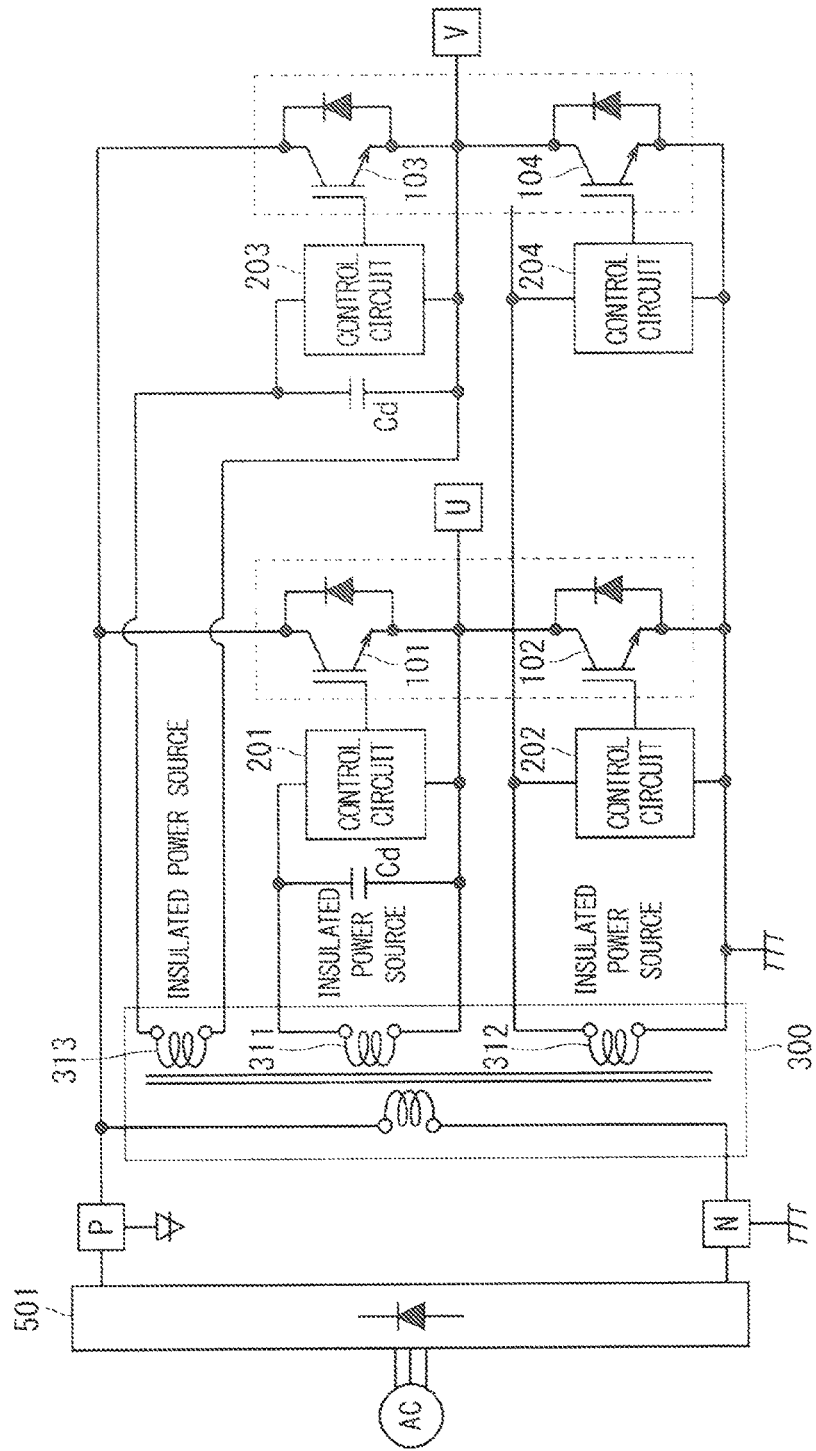
FIGS. 12 and 13 are diagrams each exemplifying a power device control circuit which controls a single-phase inverter relating to a preferred embodiment.

FIG. 12 is a diagram exemplifying a power device control circuit which controls a single-phase inverter. As exemplified in FIG. 12, such a circuit includes, as power devices, a metal-oxide-semiconductor field effect transistor (or MOSFET) 101, a MOSFET 102 totem-pole connected to the source side of the MOSFET 101, a MOSFET 103, and a MOSFET 104 totem-pole connected to the source side of the MOSFET 103, and includes a high-side control circuit 201 for controlling the gate voltage of the MOSFET 101, a low-side control circuit 202 for controlling the gate voltage of the MOSFET 102, a high-side control circuit 203 for controlling the gate voltage of the MOSFET 103, a low-side control circuit 204 for controlling the gate voltage of the MOSFET 104, a power source circuit 300 as a gate power source for the MOSFET 101, the MOSFET 102, the MOSFET 103, and the MOSFET 104, and a rectifier circuit 501 which is connected to the drain side of the MOSFET 101 and the source side of the MOSFET 102 and is connected to the drain side of the MOSFET 103 and the source side of the MOSFET 104.

The power source circuit 300 includes an insulated power source 311 for supplying a power source voltage to the high-side control circuit 201, an insulated power source 312 for supplying a power source voltage to the low-side control circuit 202 and the low-side control circuit 204, and an insulated power source 313 for supplying a power source voltage to the high-side control circuit 203.

A power device control circuit for controlling a single-phase inverter needs to have totally three insulated power sources, that is, two insulated power sources on the high side, which are the insulated power source 311 and the insulated power source 313, and one insulated power source on the low side, which is the insulated power source 312.

Further, a power device control circuit for controlling a three-phase inverter needs to have three insulated power sources on the high side, and hence needs to have totally four insulated power sources; thus, there is a problem that the size of the power device control circuit is increased.

On the other hand, in order to reduce the number of power sources, there is also a configuration in which bootstrap circuits are used as the power sources for the control circuits on the high side so that the number of power sources of the power device control circuit for controlling the three-phase inverter is reduced to one.

Figure 13:
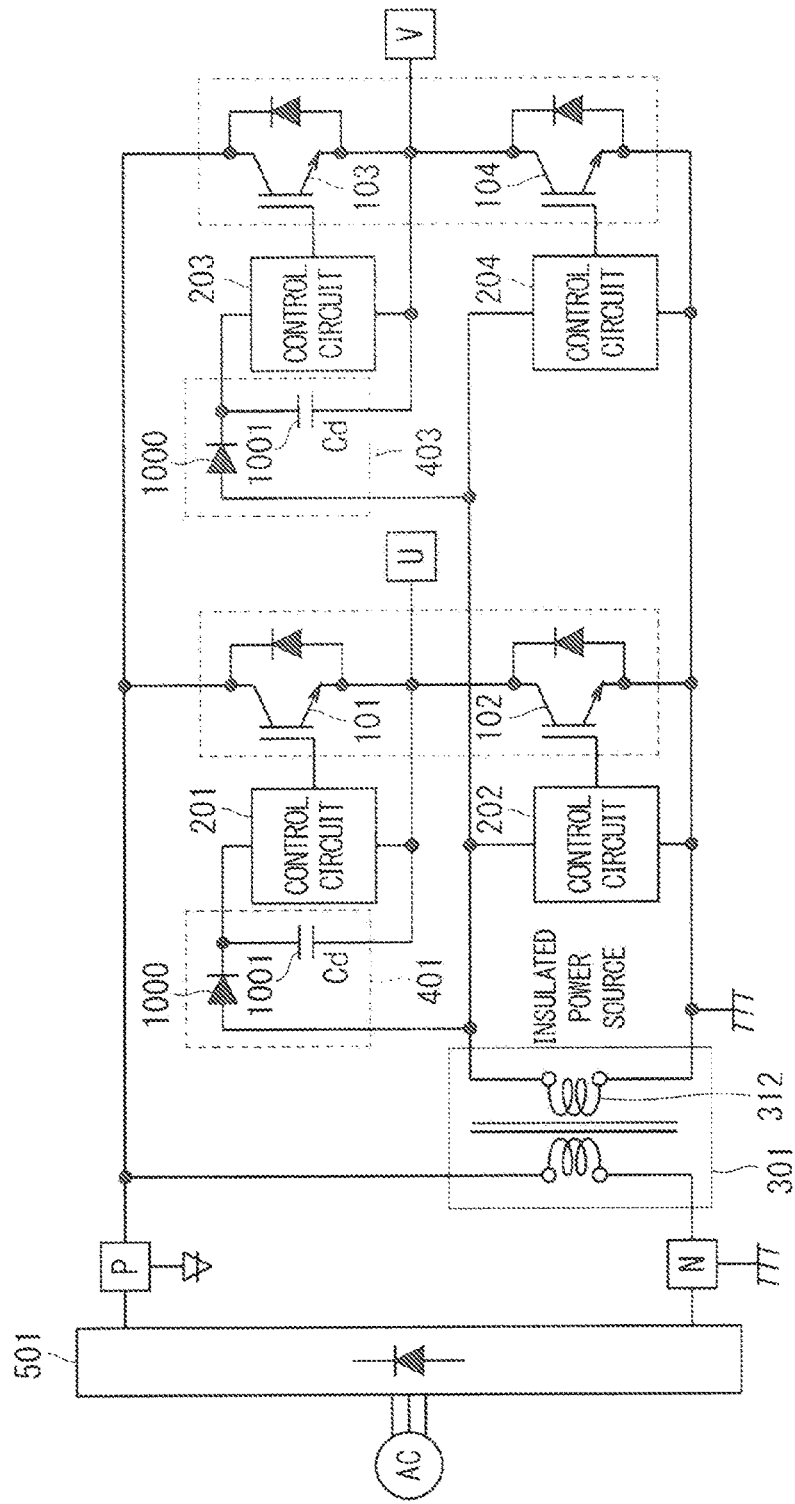

FIG. 13 is a diagram exemplifying a power device control circuit which controls a single-phase inverter. As exemplified in FIG. 13, such a circuit includes, as power devices, a metal-oxide-semiconductor field effect transistor (or MOSFET) 101, a MOSFET 102 totem-pole connected to the source side of the MOSFET 101, a MOSFET 103, and a MOSFET 104 totem-pole connected to the source side of the MOSFET 103, and includes a high-side control circuit 201 for controlling the gate voltage of the MOSFET 101, a low-side control circuit 202 for controlling the gate voltage of the MOSFET 102, a high-side control circuit 203 for controlling the gate voltage of the MOSFET 103, a low-side control circuit 204 for controlling the gate voltage of the MOSFET 104, a power source circuit 301 as a gate power source for the MOSFET 101, the MOSFET 102, the MOSFET 103, and the MOSFET 104, a bootstrap circuit 401 connected between the power source circuit 301 and the high-side control circuit 201, a bootstrap circuit 403 connected between the power source circuit 301 and the high-side control circuit 203, and a rectifier circuit 501 which is connected to the drain side of the MOSFET 101 and the source side of the MOSFET 102 and is connected to the drain side of the MOSFET 103 and the source side of the MOSFET 104.

The power source circuit 301 includes an insulated power source 312. The bootstrap circuit 401 and the bootstrap circuit 403 each include a diode 1000 and a capacitor 1001.

The anode of the diode 1000 in the bootstrap circuit 401 is connected to the power source circuit 301. Further, the cathode of the diode 1000 in the bootstrap circuit 401 is connected to the high-side control circuit 201.

One end of the capacitor 1001 in the bootstrap circuit 401 is connected to a connection point between the MOSFET 101 and MOSFET 102, and the other end is connected to the cathode of the diode 1000.

However, the bootstrap circuit cannot charge the capacitor 1001 when the power device on the high side is operating in an on-state. Therefore, when the power device on the high side operates in an on-state for a long time, a power source voltage goes down; therefore, it is difficult to apply a bootstrap circuit to a control method in which the power device operates in an on-state for a long time.

Figure 14:
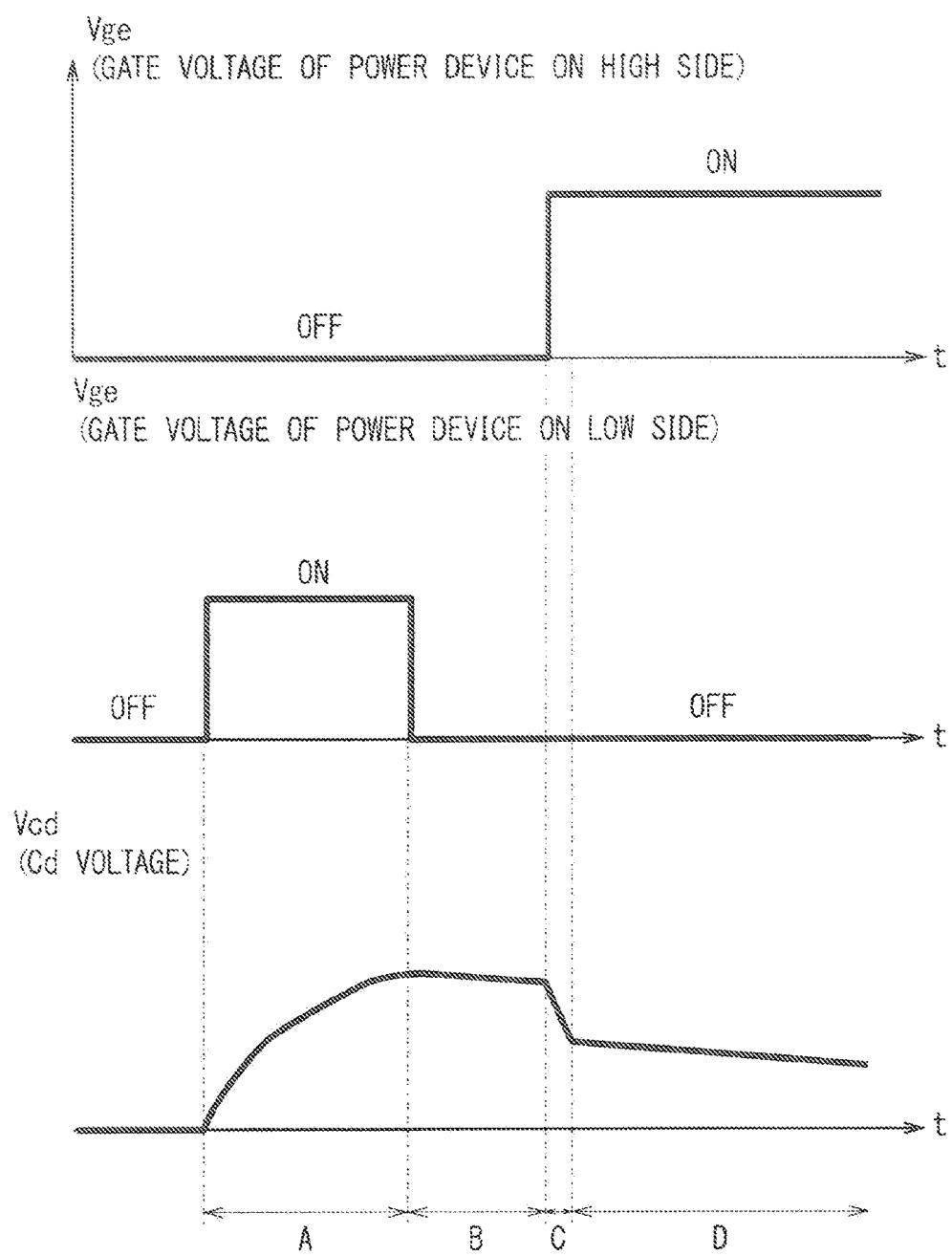
FIG. 14 is a diagram exemplifying behaviors of gate voltages and a capacitor voltage in the power device control circuit exemplified in FIG. 13.

FIG. 14 is a diagram exemplifying behaviors of gate voltages and a capacitor voltage in the power device control circuit exemplified in FIG. 13. FIG. 14 exemplifies the gate voltage of the power device on the high side, the gate voltage of the power device on the low side, and the capacitor voltage in the bootstrap circuit.

As exemplified in FIG. 14, in the period A, the gate voltage of the power device on the high side is in an off-state and the gate voltage of the power device on the low side is in an on-state; thus, the capacitor in the bootstrap circuit is charged, so that the capacitor voltage rises.

In the period B, the gate voltage of the power device on the low side is in an off-state; thus, the capacitor in the bootstrap circuit is discharged, so that the capacitor voltage decreases.

In the period C, the gate voltage of the power device on the high side turns from the off-state into the on-state; thus, the capacitor in the bootstrap circuit is discharged, so that the capacitor voltage decreases rapidly.

In the period D, the gate voltage of the power device on the high side is on the on-state and the gate voltage of the power device on the low side is in the off-state; thus, the capacitor in the bootstrap circuit is discharged, so that the capacitor voltage decreases. If this period is long, the capacitor voltage decreases greatly.

To address this issue, a bootstrap compensation circuit is proposed to achieve that the capacitor in the bootstrap circuit can be sufficiently charged and that the circuit is simplified and downsized.

Figure 15:
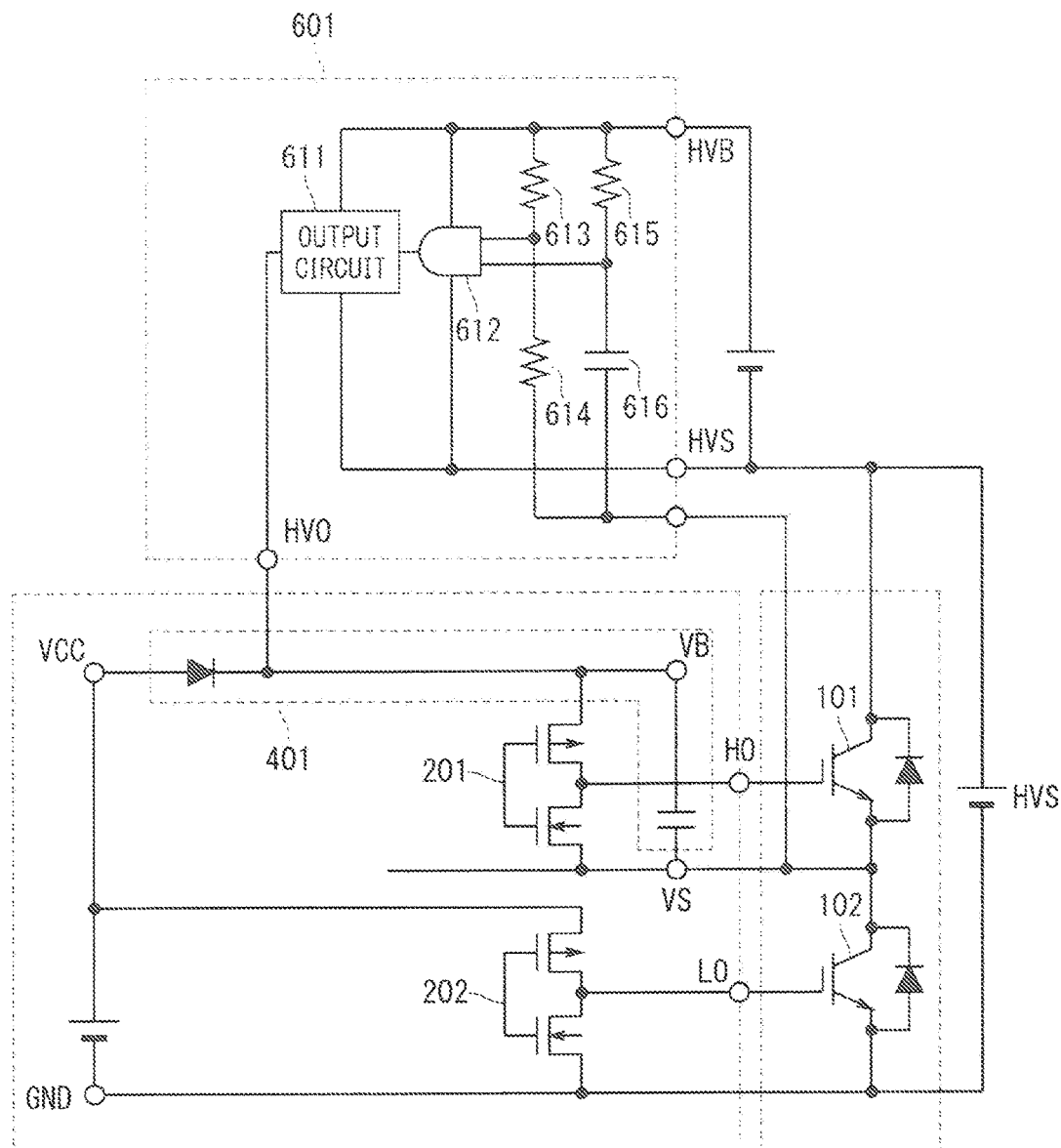
FIG. 15 is a diagram exemplifying a power device control circuit having a bootstrap compensation circuit relating to a preferred embodiment.

FIG. 15 is a diagram exemplifying a power device control circuit having a bootstrap compensation circuit. As exemplified in FIG. 15, the circuit includes a MOSFET 101 and a MOSFET 102 totem-pole connected to the source side of the MOSFET 101, a high-side control circuit 201 which controls the gate voltage of the MOSFET 101, a low-side control circuit 202 which controls the gate voltage of the MOSFET 102, a bootstrap circuit 401 connected to the high-side control circuit 201, and a bootstrap compensation circuit 601 connected to the high-side control circuit 201 and the bootstrap circuit 401.

The bootstrap compensation circuit 601 includes a resistive voltage divider circuit provided across a floating potential HVB on a high-voltage side and a reference potential VS, a transient response detection circuit parallel-connected to the resistive voltage divider circuit, an AND circuit 612, and an output circuit 611.

The resistive voltage divider circuit is a circuit in which a resistor 613 and a resistor 614 are series-connected. The transient response detection circuit is a circuit in which a resistor 615 and a capacitor 616 are series-connected. Note that the number of resistors in the resistive voltage divider circuit is not limited to two, and may be two or more.

However, in the case that a bootstrap compensation circuit is used, the response speed of the bootstrap compensation circuit should be considered when taking into account a possible application of the bootstrap compensation circuit in which a high voltage such as 600 V or 1200 V is applied.

Figure 16:
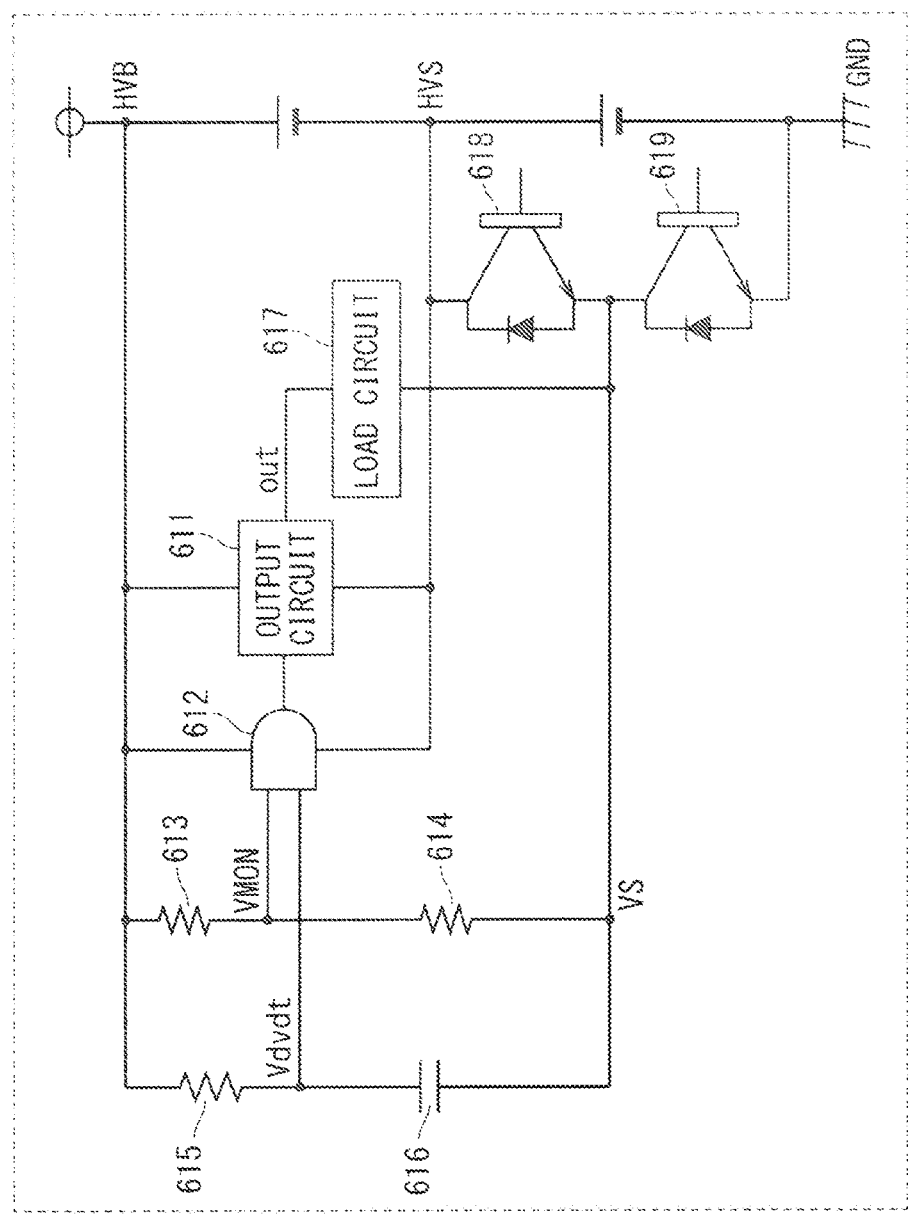
FIG. 16 is a diagram exemplifying a bootstrap compensation circuit and the like relating to a preferred embodiment.

FIG. 16 is a diagram exemplifying a bootstrap compensation circuit and the like. As exemplified in FIG. 16, the bootstrap compensation circuit includes a resistive voltage divider circuit provided across a floating potential HVB and a reference potential VS, a transient response detection circuit parallel-connected to the resistive voltage divider circuit, an AND circuit 612, an output circuit 611, a load circuit 617, a transistor 618, and a transistor 619.

The resistive voltage divider circuit is a circuit in which the resistor 613 and the resistor 614 are series-connected. The transient response detection circuit is a circuit in which the resistor 615 and the capacitor 616 are series-connected.

To the AND circuit 612 are applied (i) the point between the resistor 613 and the resistor 614, that is, a divided potential extraction point VMON of the resistive voltage divider circuit and (ii) a transient response signal Vdvdt between the resistor 615 and the capacitor 616, that is, the output of the transient response detection circuit. Further, the output of the AND circuit 612 is input to the output circuit 611.

The output of the output circuit 611 is input to the load circuit 617, further to the transistor 618 and the transistor 619.

The output circuit 611 is controlled to be in an on-state or an off-state by the floating potential HVB floatingly moving with respect to the reference potential VS and by the floating potential HVB increasing and decreasing with respect to the reference potential VS. The potential of the floating potential HVB with respect to the reference potential VS is detected based on whether the output of the resistive voltage divider circuit provided between the floating potential HVB and the reference potential VS is higher than a predetermined threshold value, and the case that the threshold value is exceeded and the case that the threshold value is not exceeded are respectively defined as "H" and "L". According to the result of the potential detection, the drive of the output circuit 611 is controlled.

Here, the resistive voltage divider circuit needs to be provided between the high-voltage side of the power source voltage and the reference potential as described above. Further, the resistive voltage divider circuit needs to have resistors having such high resistances that the current flowing through the voltage dividing resistors is made small.

As a result, a current consumption in the voltage dividing resistors is reduced, but at the same time a time constant of a CR circuit formed by the voltage dividing resistors and an accompanying parasitic capacitance is increased, whereby the response speed is lowered.

The output of the output circuit is switched from the on-state to the off-state due to the switching of the output of the resistive voltage divider circuit when the power source voltage becomes higher than the reference potential. However, because the output response of the resistive voltage divider circuit is slower than the change of the power source voltage, the switching of the output circuit between the on-state and the off-state is also delayed.

In the case that a load circuit of the output circuit is provided between the output circuit and the reference potential, an excessive electric power is applied to the load circuit and the output circuit since the power source voltage rises and until the output circuit goes into the off-state.

Further, in order to address the above-described decrease in the response speed, there is a method in which a transient response signal is used to achieve a high-speed response. However, even in this case, the output circuit goes into an on-state after disappearance of the transient response signal which appears quickly but does not last long and until generation of a direct current signal which lasts long but is generated late, and an excessive electric power is applied to the load circuit and the output circuit after all.

Note that an allowable power consumption is normally several hundreds of milliwatts or lower, considering a heat dissipation property of an IC package. In order to satisfy the above-described condition when a high voltage such as 600 V or 1200 V is applied, it is necessary to use voltage dividing resistors with resistances of meg-ohms.

If the parasitic capacitance accompanying the above-described voltage dividing resistors is several picofarads, the time constant is calculated by a formula (M$\Omega$×several picofarads), and the response speed is in the order of a microsecond. On the other hand, the transient response between the floating potential HVB on the high-voltage side and the reference potential VS is in the order of several kilovolts per microsecond. As a result, before the response occurs in a period in the order of a microsecond and the output circuit goes into the off-state, an excessive electric power such as several tens of watts is applied to the load circuit and the output circuit.

<Configuration>

FIG. 1 is a diagram exemplifying a bootstrap compensation circuit relating to the present preferred embodiment.

As exemplified in FIG. 1, the circuit includes a resistive voltage divider circuit provided across a floating potential HVB on a high-voltage side and a reference potential VS, a transient response detection circuit parallel-connected to the resistive voltage divider circuit, an AND circuit 612, an output circuit 611, a load circuit 617, and a capacitor 701.

The resistive voltage divider circuit is a circuit in which a resistor 613 and a resistor 614 are series-connected. The transient response detection circuit is a circuit in which a resistor 615 and a capacitor 616 are series-connected. The capacitor 701 is provided between a divided potential extraction point VMON and the reference potential VS.

The output circuit 611 is controlled to be in an on-state or an off-state by the floating potential HVB floatingly moving with respect to the reference potential VS and by the floating potential HVB increasing and decreasing with respect to the reference potential VS. The potential of the floating potential HVB with respect to the reference potential VS is detected based on whether the output of the resistive voltage divider circuit provided between the floating potential HVB and the reference potential VS is higher than a predetermined threshold value, and the case that the threshold value is exceeded and the case that the threshold value is not exceeded are respectively defined as "H" and "L". Then, according to the result of the potential detection, the drive of the output circuit 611 is controlled.

The control of the output circuit 611 between the on-state and the off-state is performed by using the resistive voltage divider circuit and the AND circuit 612 in terms of direct current, similarly to the conventional method. For example, when the potential difference between the floating potential HVB and the reference potential VS becomes decreases and hence the divided potential extraction point VMON is on an "H" level with respect to the AND circuit 612, the output circuit 611 is controlled to become in the on-state. Further, when the potential difference between the floating potential HVB and the reference potential VS increases and hence the divided potential extraction point VMON is on an "L" level with respect to the AND circuit 612, the output circuit 611 is controlled to become in the off-state.

The transient response signal Vdvdt, which is the output of the transient response detection circuit, is constantly equal to the floating potential HVB in terms of a direct current operation and is constantly on an "H" level with respect to the AND circuit 612. Therefore, the control of the output circuit 611 is performed only by the resistive voltage divider circuit.

FIG. 2 is a diagram exemplifying a connection aspect between the output circuit 611 and the load circuit 617. As exemplified in FIG. 2, the output circuit 611 includes a NOT circuit 901, a NOT circuit 902 connected to the output side of the NOT circuit 901, a NOT circuit 903 connected to the output side of the NOT circuit 902, and a p-type MOSFET 904. The gate of the MOSFET 904 is connected to the output side of the NOT circuit 903, the drain is connected to a power source voltage HVS, and the source is connected to the floating potential HVB.

Figure 3:
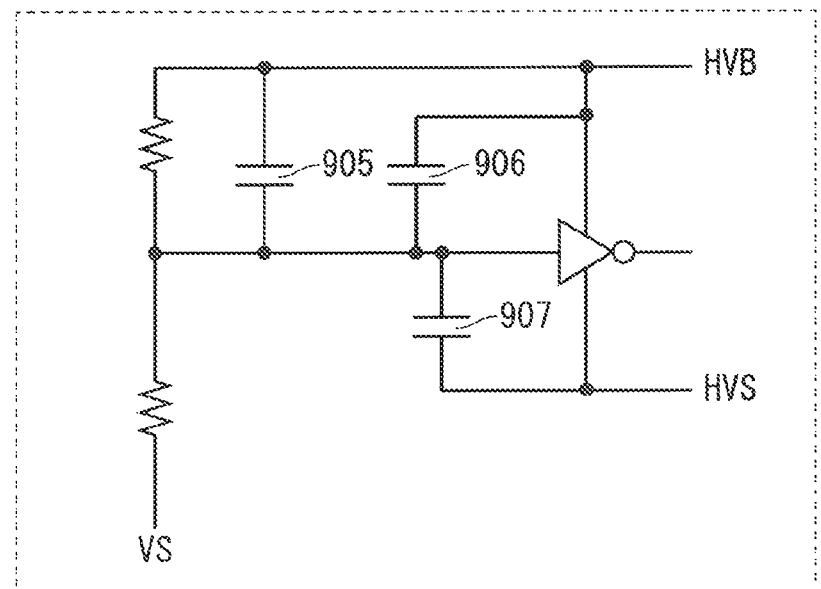
FIG. 3 is a diagram for describing parasitic capacitances relating to a preferred embodiment.

FIG. 3 is a diagram for describing parasitic capacitances. As exemplified in FIG. 3, the output circuit includes a parasitic capacitance 905 corresponding to an inter-wire capacitance and the like, and a parasitic capacitance 906 and a parasitic capacitance 907 corresponding to a gate-drain capacitance, a gate-source capacitance, or a mirror capacitance.

Regarding a transient response in the above-described circuit, since the parasitic capacitances are as exemplified in FIG. 3, the divided potential extraction point VMON of the resistive voltage divider circuit is delayed with respect to the transition of the potential between the floating potential HVB and the reference potential VS. This is because the potential of the divided potential extraction point VMON is capacitively coupled to the floating potential HVB or the power source voltage HVS due to the parasitic capacitances and because, when the floating potential HVB or the power source voltage HVS moves with respect to the reference potential VS, the divided potential extraction point VMON also moves following the movement.

However, when the capacitor 701 is provided between the reference potential VS and the divided potential extraction point VMON as exemplified in the present preferred embodiment, the potential of the divided potential extraction point VMON is capacitively coupled to the reference potential VS. With this arrangement, the potential of the divided potential extraction point VMON tries to keep the potential relationship with the reference potential VS; therefore, the potential of the divided potential extraction point VMON is less likely to follow the floating potential HVB or the power source voltage HVS. As a result, when the potential of the floating potential HVB or the power source voltage HVS rises with respect to the reference potential VS, the potential of the divided potential extraction point VMON steeply becomes lower than the predetermined threshold value. Therefore, the delay in controlling the output circuit 611 into the off-state can be reduced.

With this operation, the direct current signal can be generated before the transient response signal Vdvdt, which is generated at the time when the floating potential HVB or the power source voltage HVS rises with respect to the reference potential VS, disappears.

Further, also in the operation that the potential difference between the floating potential HVB or the power source voltage HVS and the reference potential VS decreases and the output circuit is thus turned into the on-state, the potential of the divided potential extraction point VMON steeply becomes higher than the predetermined threshold value due to the capacitor 701 provided between the reference potential VS and the divided potential extraction point VMON. As a result, it is possible to reduce the delay in controlling the output circuit 611 into the on-state.

Further, with the present preferred embodiment, in the case that it can be determined that the direct current signal from the divided potential extraction point VMON to turn the output circuit 611 to the off-state is generated rapidly enough, the transient response detection circuit can be omitted.

<Operation>

Figure 4:
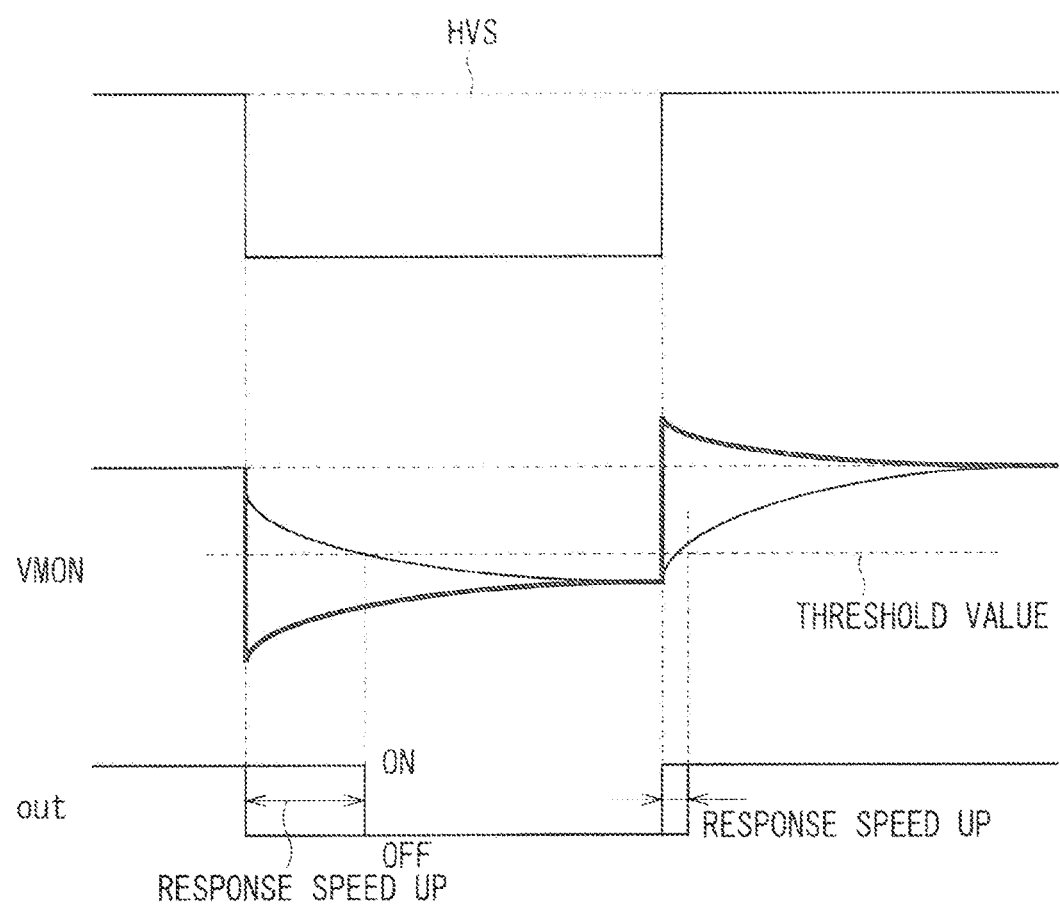
FIG. 4 is a time chart showing an operation of a bootstrap compensation circuit relating to a preferred embodiment.

FIG. 4 is a time chart showing an operation of the bootstrap compensation circuit relating to the present preferred embodiment. FIG. 4 exemplifies each of the potentials of the reference potential VS, the divided potential extraction point VMON, and the output signal of the output circuit 611. Note that the potential of the divided potential extraction point VMON is represented by a heavy line for the case where the capacitor 701 is provided and by a thin line for the case where the capacitor 701 is not provided.

With reference to FIG. 4, comparison of the potentials of the divided potential extraction point VMON at the time of the power source voltage HVS rising with respect to the reference potential VS shows that, in the case that the capacitor 701 is not provided, the potential of the divided potential extraction point VMON follows the power source voltage HVS and the potential of the divided potential extraction point VMON decreases relatively slowly. Then, when the potential of the divided potential extraction point VMON becomes lower than the predetermined threshold value, the output circuit 611 goes into the off-state. In contrast, in the case that the capacitor 701 is provided, because the potential of the divided potential extraction point VMON tries to keep the potential relationship with the reference potential VS, the potential of the divided potential extraction point VMON decreases rapidly. Then, the potential of the divided potential extraction point VMON immediately becomes lower than the predetermined threshold value, and the output circuit 611 goes into the off-state.

Further, comparison of the potentials of the divided potential extraction point VMON at the time when the potential difference between the power source voltage HVS and the reference potential VS decreases shows that, in the case that the capacitor 701 is not provided, the potential of the divided potential extraction point VMON follows the power source voltage HVS and the potential of the divided potential extraction point VMON increases relatively slowly. Then, when the potential of the divided potential extraction point VMON becomes higher than the predetermined threshold value, the output circuit 611 goes into the on-state. In contrast, in the case that the capacitor 701 is provided, because the potential of the divided potential extraction point VMON tries to keep the potential relationship with the reference potential VS, the potential of the divided potential extraction point VMON increases rapidly. Then, the potential of the divided potential extraction point VMON immediately becomes higher than the predetermined threshold value, and the output circuit 611 goes into the on-state.

The above description shows that, in the case that the capacitor 701 is provided, the response speed of the bootstrap compensation circuit can be improved.

Note that the positions to which the capacitor 701 is connected is not limited to the divided potential extraction point VMON and the reference potential VS, and by providing two or more points on the path from the floating potential HVB to the reference potential VS in the resistive voltage divider circuit, the same effects can also be obtained.

Second Preferred Embodiment

A bootstrap compensation circuit and a power module relating to the present preferred embodiment will be described. Hereinafter, configurations similar to the configurations described in the above-described preferred embodiment are assigned the same reference numerals, and the description of the configurations will be appropriately omitted.

<Configuration>

Figure 5:
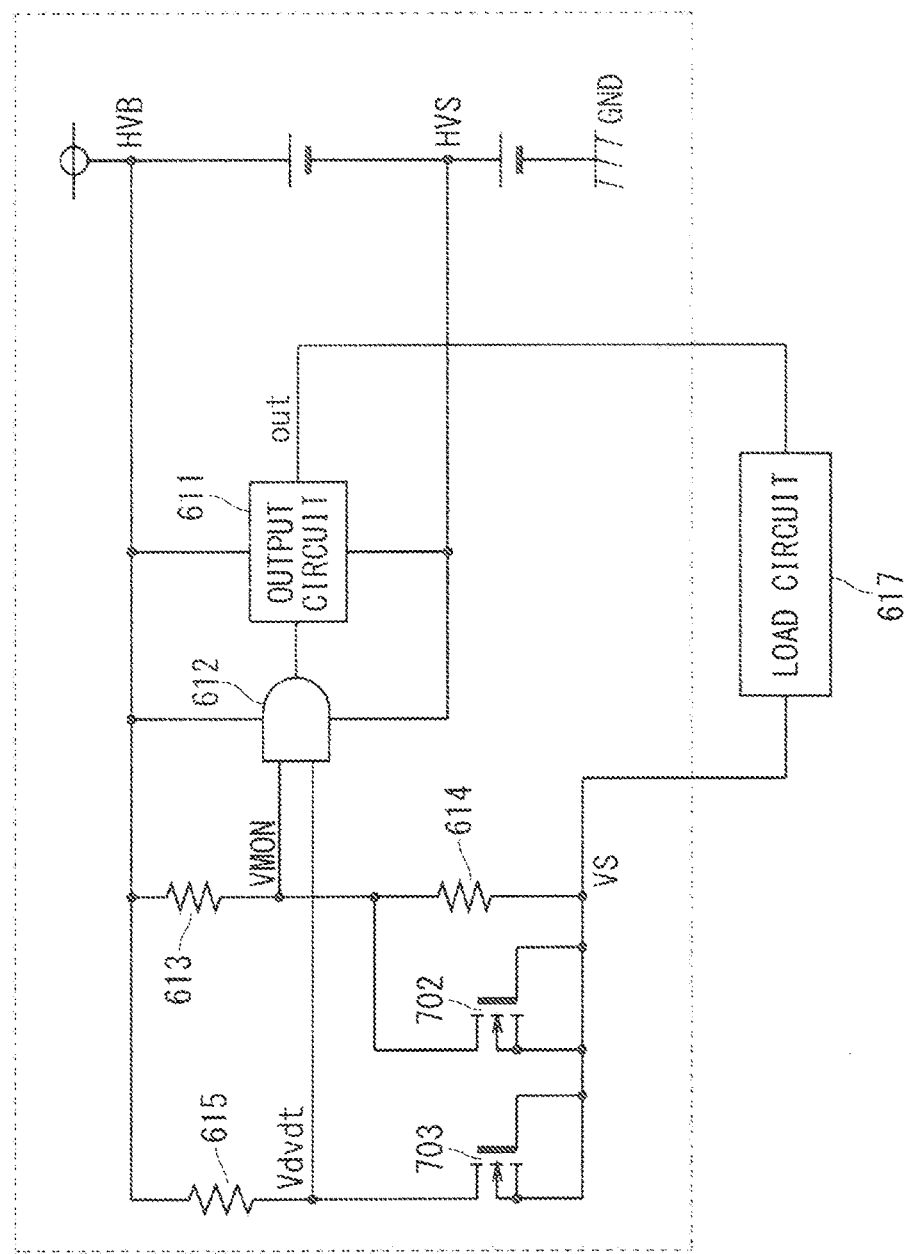
FIGS. 5 and 6 are diagrams each exemplifying a bootstrap compensation circuit relating to a preferred embodiment.

FIG. 5 is a diagram exemplifying a bootstrap compensation circuit relating to the present preferred embodiment.

As exemplified in FIG. 5, the circuit includes a resistive voltage divider circuit provided across a floating potential HVB on a high-voltage side and a reference potential VS, a transient response detection circuit parallel-connected to the resistive voltage divider circuit, an AND circuit 612, and an output circuit 611, a load circuit 617, and a MOSFET 702.

The resistive voltage divider circuit is a circuit in which a resistor 613 and a resistor 614 are series-connected. The transient response detection circuit is a circuit in which a resistor 615 and a MOSFET 703 are series-connected. The MOSFET 702 is provided between a divided potential extraction point VMON and the reference potential VS.

Each of the MOSFET 702 and the MOSFET 703 is used constantly in the state that the channel is in an off-state with the gate and the source being connected. As for the MOSFET 702, the drain is connected to the divided potential extraction point VMON, and the source is connected to the reference potential VS. As for the MOSFET 703, the drain is connected to the potential of the transient response signal Vdvdt, and the source is connected to the reference potential VS. In the above-described circuit, as for each of the MOSFET 702 and the MOSFET 703, the capacitance between the drain and the back gate is used.

In the case that a capacitor is made using, for example, a gate oxide film, the gate oxide film needs to be formed to be thicker so as to secure a withstand voltage. In that case, a current capacity of a MOSFET usually used for a logic circuit and the like is low, and in order to secure an enough current capacity, the area occupied by the MOSFET needs to be larger.

In the bootstrap compensation circuit relating to the present preferred embodiment, the structure formed as an element having a high source-drain breakdown voltage is diverted for a capacitor; thus, the structure can be applied to elements in an IC without adding a process or the like even in the case that a high voltage such as 600 V or 1200 V is applied.

Third Preferred Embodiment

A bootstrap compensation circuit and a power module relating to the present preferred embodiment will be described. Hereinafter, configurations similar to the configurations described in the above-described preferred embodiment are assigned the same reference numerals, and the description of the configurations will be appropriately omitted.

<Configuration>

Figure 6:
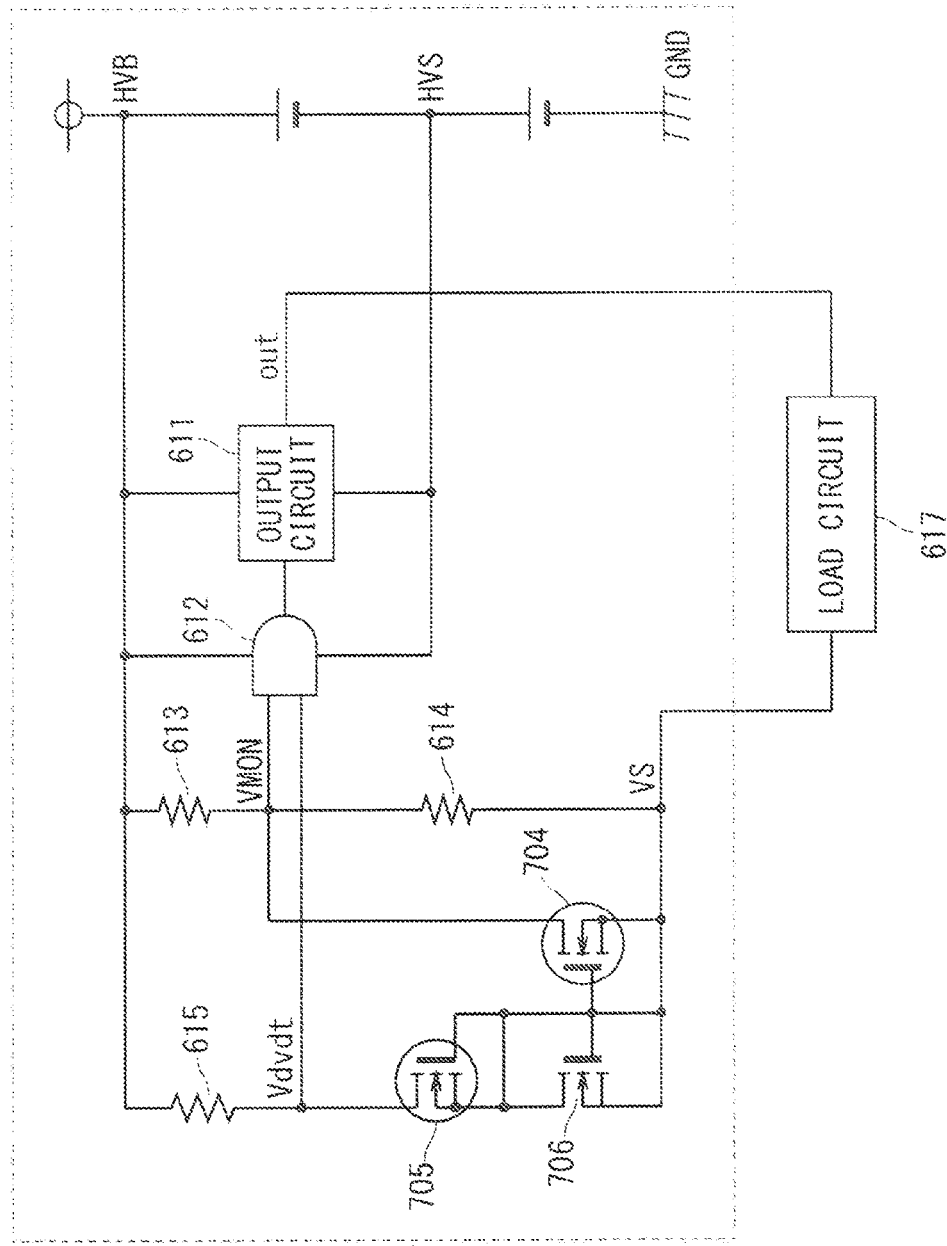

FIG. 6 is a diagram exemplifying a bootstrap compensation circuit relating to the present preferred embodiment.

As exemplified in FIG. 6, the circuit includes a resistive voltage divider circuit provided across a floating potential HVB on a high-voltage side and a reference potential VS, a transient response detection circuit parallel-connected to the resistive voltage divider circuit, an AND circuit 612, and an output circuit 611, a load circuit 617, and a MOSFET 704.

The resistive voltage divider circuit is a circuit in which a resistor 613 and a resistor 614 are series-connected. The transient response detection circuit is a circuit in which a resistor 615, a MOSFET 705, and an n-type MOSFET 706 are series-connected. The MOSFET 704 is provided between a divided potential extraction point VMON and the reference potential VS.

One end of the resistor 615 is connected to the floating potential HVB. The gate and the source of the MOSFET 705 are connected. The gate and the drain of the MOSFET 706 are connected. As for the MOSFET 705, the drain is connected to the potential of the transient response signal Vdvdt, and the source is connected to the drain of the MOSFET 706. As for the MOSFET 706, the drain is connected to the source of the MOSFET 705, and the source is connected to the reference potential VS. As for the MOSFET 704, the drain is connected to the divided potential extraction point VMON, and the source is connected to the reference potential VS. Further, the gate of the MOSFET 704, the gate of the MOSFET 705, and the gate of the MOSFET 706 are connected to one another.

The MOSFET 706 generates a gate voltage according to the characteristics of an n-type MOSFET when a transient current flows, and the gate voltage biases the gate of another n-type MOSFET, that is, the MOSFET 704.

The MOSFET 704 is configured to draw, from the divided potential extraction point VMON, a current corresponding to the current flowing through the transient response detection circuit.

The first preferred embodiment has a configuration in which the capacitor is provided between the divided potential extraction point VMON and the reference potential VS so that a current is drawn from the divided potential extraction point VMON as a charging current to the capacitor when the potential difference between the floating potential HVB or the power source voltage HVS and the reference potential VS increases.

In contrast to that, in the present preferred embodiment, the current flowing from the divided potential extraction point VMON is the drain source current of an n-type MOSFET.

In the first preferred embodiment, the charging current to the capacitor largely depends on an area of the capacitor; however, in the present preferred embodiment, if a current ratio of the resistive voltage divider circuit to the transient response detection circuit is set large, a larger current can be drawn from the divided potential extraction point VMON. As a result, it is possible to prevent or reduce increase in the circuit size.

Further, the current ratio of the resistive voltage divider circuit to the transient response detection circuit can be set large, and a current can be drawn from the divided potential extraction point VMON by using a small-sized n-type MOSFET. Further, since the MOSFET 704 is used in combination with the transient response circuit having a high-speed response, it is possible to compensate for a disadvantage that the transient response signal Vdvdt output from the transient response circuit does not last long.

Figure 7:
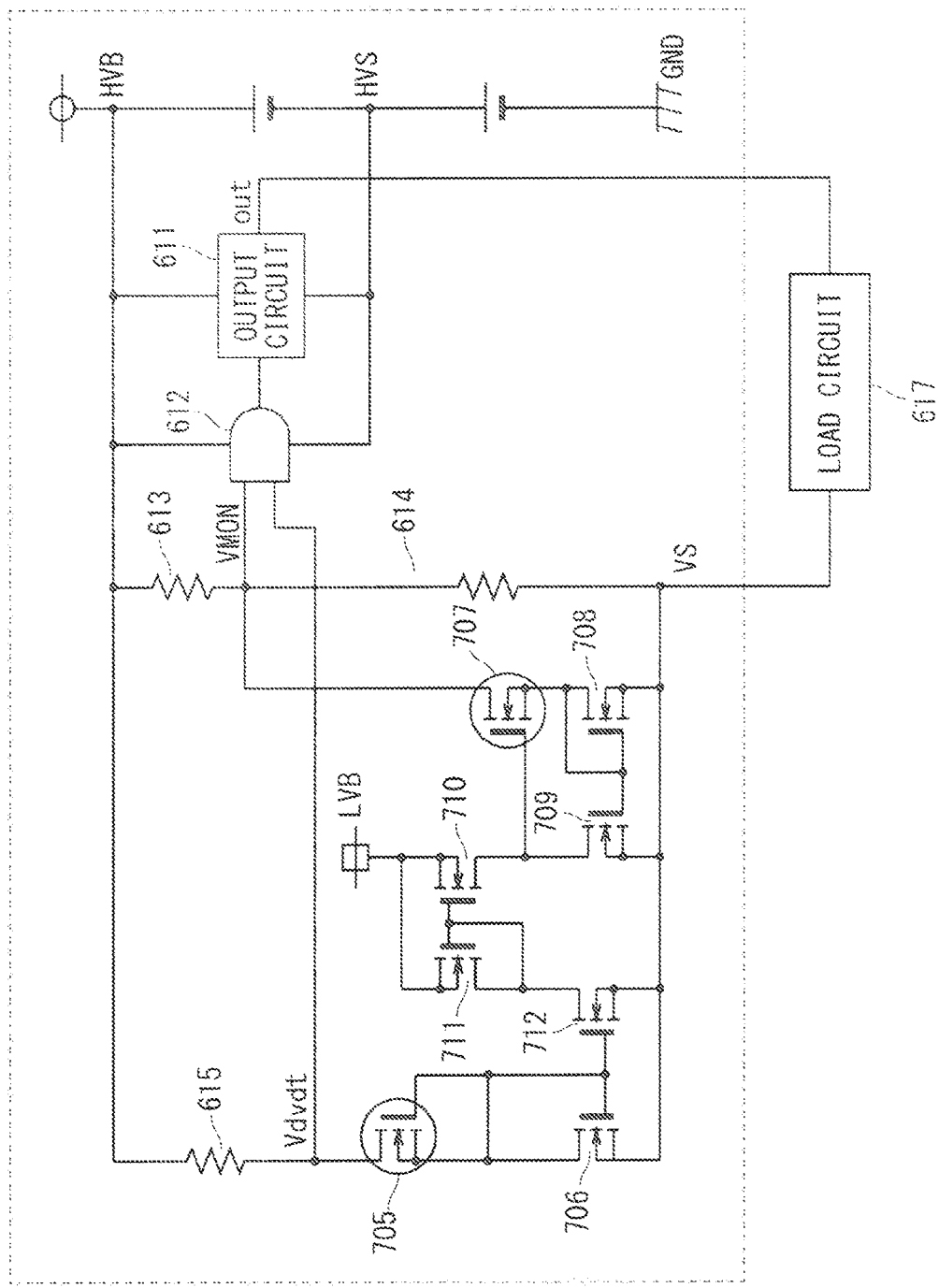
FIG. 7 is a diagram exemplifying a modified example of a bootstrap compensation circuit relating to a preferred embodiment.

FIG. 7 is a diagram exemplifying a modified example of a bootstrap compensation circuit relating to the present preferred embodiment.

As exemplified in FIG. 7, the circuit includes a resistive voltage divider circuit provided across a floating potential HVB on a high-voltage side and a reference potential VS, a transient response detection circuit parallel-connected to the resistive voltage divider circuit, an AND circuit 612, and an output circuit 611, a MOSFET 707, a MOSFET 708, a MOSFET 709, a MOSFET 710, a MOSFET 711, and a MOSFET 712.

The resistive voltage divider circuit is a circuit in which a resistor 613 and a resistor 614 are series-connected. The transient response detection circuit is a circuit in which a resistor 615, a MOSFET 705, and a MOSFET 706 are series-connected. The MOSFET 707 and the MOSFET 708 are provided between a divided potential extraction point VMON and the reference potential VS.

The gate and the source of the MOSFET 705 are connected. The gate and the drain of the MOSFET 706 are connected. The gate and the drain of the MOSFET 708 are connected. The gate and the drain of the MOSFET 711 are connected. As for the MOSFET 705, the drain is connected to the potential of the transient response signal Vdvdt, and the source is connected to the drain of the MOSFET 706. As for the MOSFET 706, the drain is connected to the source of the MOSFET 705, and the source is connected to the reference potential VS. As for the MOSFET 707, the drain is connected to the divided potential extraction point VMON, and the source is connected to the drain of the MOSFET 708. As for the MOSFET 708, the drain is connected to the source of the MOSFET 707, the source is connected to the reference potential VS. As for the MOSFET 709, the drain is connected to the drain of the MOSFET 710, and the source is connected to the reference potential VS. As for the MOSFET 710, the drain is connected to the drain of the MOSFET 709, and the source is connected to a power source potential LVB. As for the MOSFET 711, the drain is connected to the drain of the MOSFET 712, and the source is connected to the power source potential LVB. As for the MOSFET 712, the drain is connected to the drain of the MOSFET 711, and the source is connected to the reference potential VS.

The gate of the MOSFET 712, the gate of the MOSFET 705, and the gate of the MOSFET 706 are connected to one another. Further, the gate of the MOSFET 710 and the gate of the MOSFET 711 are connected to each other. Further, the gate of the MOSFET 708 and the gate of the MOSFET 709 are connected to each other. Further, the gate of the MOSFET 707 is connected to the drain of the MOSFET 709.

Fourth Preferred Embodiment

A bootstrap compensation circuit and a power module relating to the present preferred embodiment will be described. Hereinafter, configurations similar to the configurations described in the above-described preferred embodiment are assigned the same reference numerals, and the description of the configurations will be appropriately omitted.

<Configuration>

Figure 8:
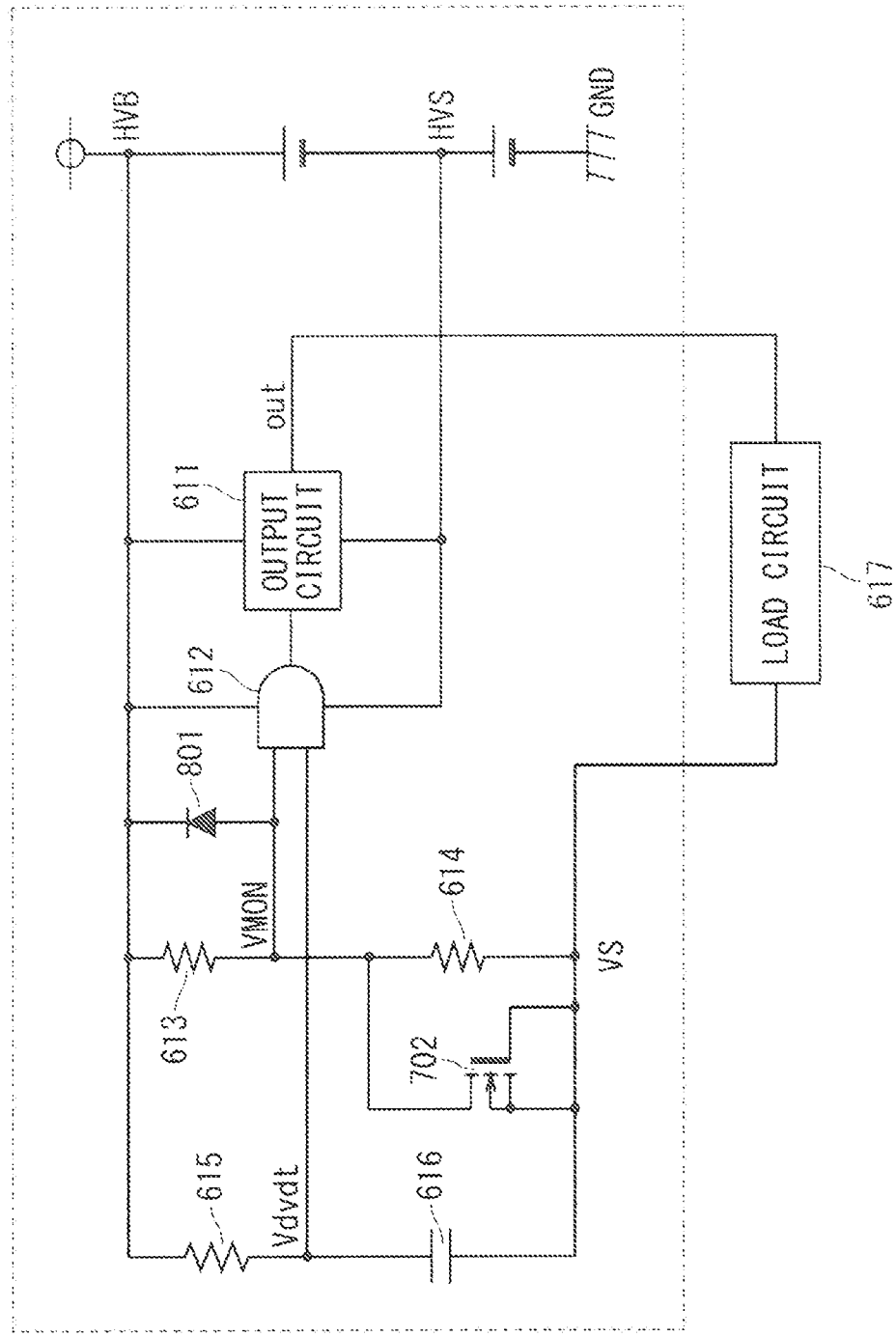
FIGS. 8 to 9 are diagrams each exemplifying a bootstrap compensation circuit relating to a preferred embodiment.

FIG. 8 is a diagram exemplifying a bootstrap compensation circuit relating to the present preferred embodiment.

As exemplified in FIG. 8, the circuit includes a resistive voltage divider circuit provided across a floating potential HVB on a high-voltage side and a reference potential VS, a transient response detection circuit parallel-connected to the resistive voltage divider circuit, an AND circuit 612, and an output circuit 611, a load circuit 617, a MOSFET 702, and a diode 801.

The resistive voltage divider circuit is a circuit in which a resistor 613 and a resistor 614 are series-connected. The transient response detection circuit is a circuit in which a resistor 615 and a capacitor 616 are series-connected. The MOSFET 702 is provided between a divided potential extraction point VMON and the reference potential VS.

The MOSFET 702 is used constantly in the state that the channel is in an off-state with the gate and the source being connected. As for the MOSFET 702, the drain is connected to the divided potential extraction point VMON, and the source is connected to the reference potential VS.

The diode 801 is connected between the floating potential HVB and the divided potential extraction point VMON. The diode 801 is disposed with the cathode directed to the side of the floating potential HVB and the anode directed to the side of the divided potential extraction point VMON.

In the configuration of the first preferred embodiment, when the potential difference between the floating potential HVB or the power source voltage HVS and the reference potential VS steeply decreases, only the potential of the divided potential extraction point VMON is kept high due to the capacitor between the divided potential extraction point VMON and the reference potential VS. The divided potential extraction point VMON gradually settles down to the potential according to the ratio of the dividing resistors between the floating potential HVB and the reference potential VS; however, there is a possibility that a high voltage is applied to the gate input of the AND circuit 612 before the potential settles down.

In the present preferred embodiment, when the potential of the divided potential extraction point VMON becomes higher than the floating potential HVB, the diode 801 gets forward biased so that the divided potential extraction point VMON is clamped to the potential higher than the floating potential HVB by the forward voltage of the diode 801. As a result, it is possible to prevent a high voltage from being applied to the gate input of the AND circuit 612.

Note that the MOSFET 702 may be replaced by the capacitor 701 exemplified in FIG. 1.

Fifth Preferred Embodiment

A bootstrap compensation circuit and a power module relating to the present preferred embodiment will be described. Hereinafter, configurations similar to the configurations described in the above-described preferred embodiment are assigned the same reference numerals, and the description of the configurations will be appropriately omitted.

<Configuration>

Figure 9:
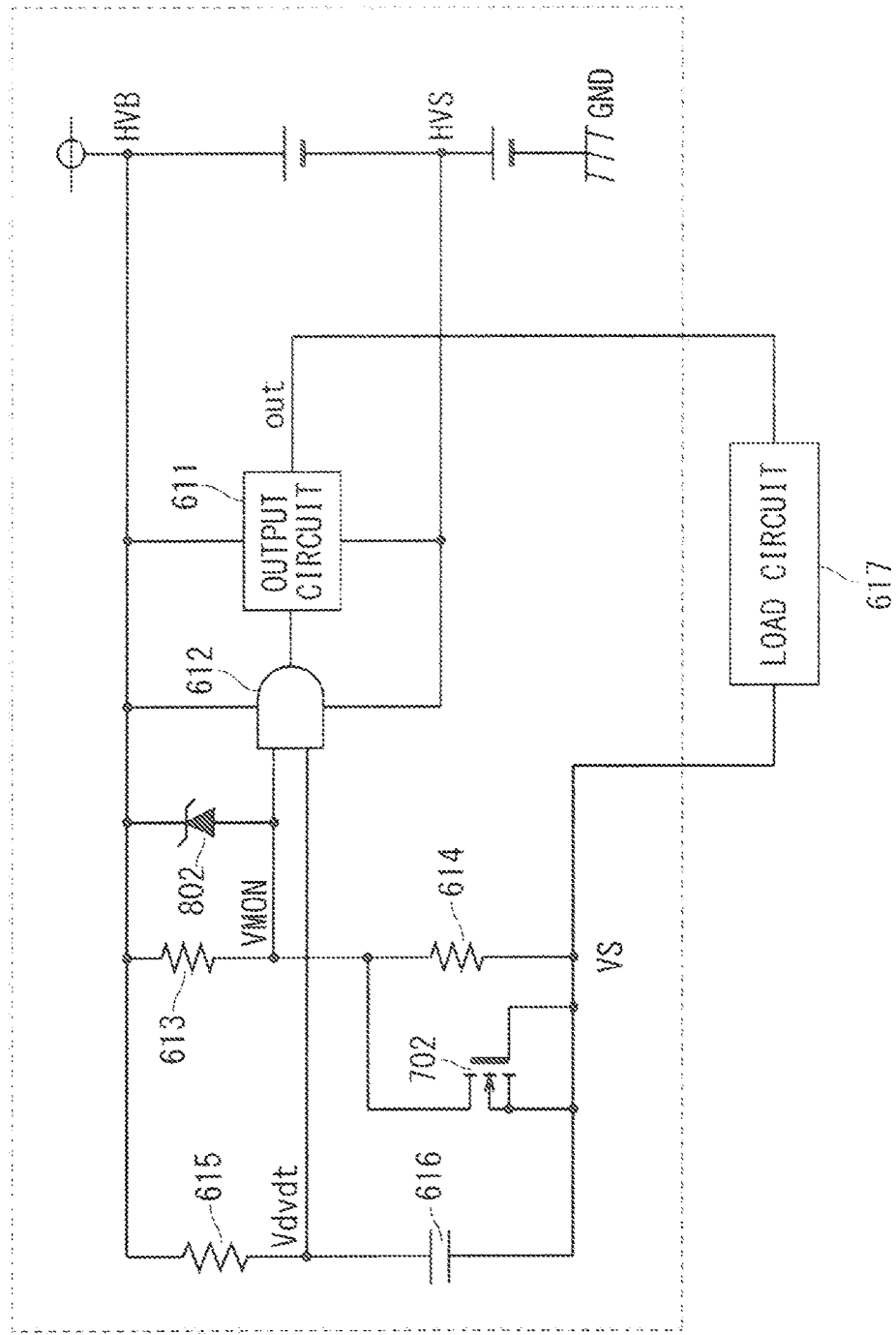

FIG. 9 is a diagram exemplifying a bootstrap compensation circuit relating to the present preferred embodiment.

As exemplified in FIG. 9, the circuit includes a resistive voltage divider circuit provided across a floating potential HVB on a high-voltage side and a reference potential VS, a transient response detection circuit parallel-connected to the resistive voltage divider circuit, an AND circuit 612, and an output circuit 611, a load circuit 617, a MOSFET 702, and a Zener diode 802.

The resistive voltage divider circuit is a circuit in which a resistor 613 and a resistor 614 are series-connected. The transient response detection circuit is a circuit in which a resistor 615 and a capacitor 616 are series-connected. The MOSFET 702 is provided between a divided potential extraction point VMON and the reference potential VS.

The MOSFET 702 is used constantly in the state that the channel is in an off-state with the gate and the source being connected. As for the MOSFET 702, the drain is connected to the divided potential extraction point VMON, and the source is connected to the reference potential VS.

The Zener diode 802 is connected between the floating potential HVB and the divided potential extraction point VMON. The Zener diode 802 is disposed with the cathode directed to the side of the floating potential HVB and the anode directed to the side of the divided potential extraction point VMON.

In the present preferred embodiment, when the potential difference between the floating potential HVB and the reference potential VS increases and the potential of the divided potential extraction point VMON is thus about to excessively decrease, the Zener diode 802 gets into a breakdown state, so that the potential of the divided potential extraction point VMON can be prevented from excessively decreasing.

With this arrangement, an effect similar to that in the fourth preferred embodiment is obtained, and in addition, there is no need to provide, for example, a clamp diode disposed between the power source voltage HVS and the divided potential extraction point VMON with the anode directed to the side of the power source voltage HVS and the cathode directed to the side of the divided potential extraction point VMON.

Note that the MOSFET 702 may be replaced by the capacitor 701 exemplified in FIG. 1.

Sixth Preferred Embodiment

A bootstrap compensation circuit and a power module relating to the present preferred embodiment will be described. Hereinafter, configurations similar to the configurations described in the above-described preferred embodiment are assigned the same reference numerals, and the description of the configurations will be appropriately omitted.

Note that the below-described bootstrap compensation circuit corresponds to the bootstrap compensation circuit as a semiconductor device of the above-described preferred embodiment.

<Configuration>

Figure 10:
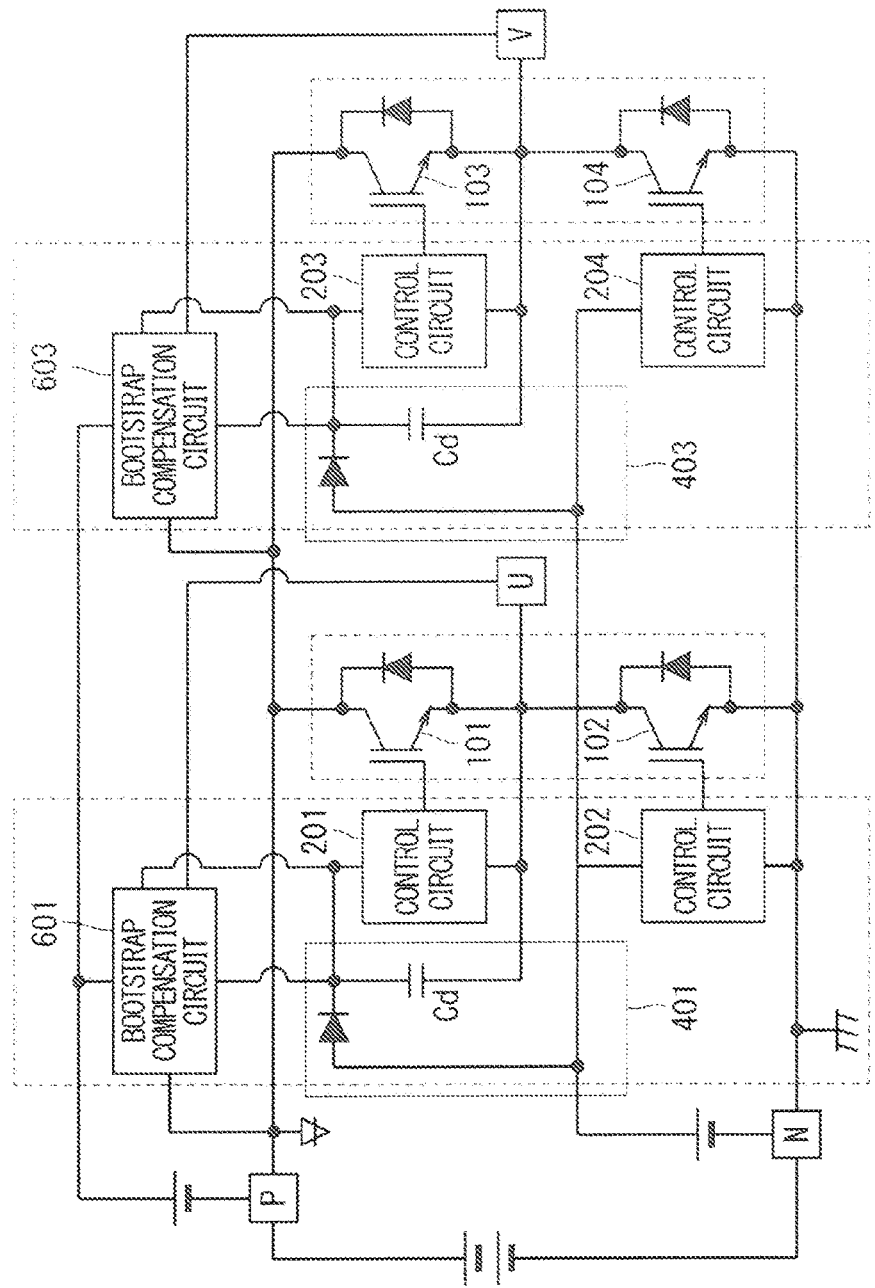
FIG. 10 is a diagram exemplifying a power device control circuit which controls a single-phase inverter relating to a preferred embodiment.

FIG. 10 is a diagram exemplifying a power device control circuit relating to the present preferred embodiment which controls a single-phase inverter. As exemplified in FIG. 10, the circuit includes a MOSFET 101, a MOSFET 102 totem-pole connected to the source side of the MOSFET 101, a MOSFET 103, a MOSFET 104 totem-pole connected to the source side of the MOSFET 103, a high-side control circuit 201 which controls the gate voltage of the MOSFET 101, a low-side control circuit 202 which controls the gate voltage of the MOSFET 102, a high-side control circuit 203 which controls the gate voltage of the MOSFET 103, a low-side control circuit 204 which controls the gate voltage of the MOSFET 104, a bootstrap circuit 401 connected to the high-side control circuit 201, a bootstrap circuit 403 connected to the high-side control circuit 203, a bootstrap compensation circuit 601 connected to the high-side control circuit 201 and the bootstrap circuit 401, and a bootstrap compensation circuit 603 connected to the high-side control circuit 203 and the bootstrap circuit 403.

FIG. 11 is a diagram exemplifying a power device control circuit relating to the present preferred embodiment which controls a three-phase inverter. As exemplified in FIG. 11, the circuit includes a MOSFET 101, a MOSFET 102 totem-pole connected to the source side of the MOSFET 101, a MOSFET 103, a MOSFET 104 totem-pole connected to the source side of the MOSFET 103, a MOSFET 105, a MOSFET 106 totem-pole connected to the source side of the MOSFET 105, a high-side control circuit 201 which controls the gate voltage of the MOSFET 101, a low-side control circuit 202 which controls the gate voltage of the MOSFET 102, a high-side control circuit 203 which controls the gate voltage of the MOSFET 103, a low-side control circuit 204 which controls the gate voltage of the MOSFET 104, a high-side control circuit 205 which controls the gate voltage of the MOSFET 105, a low-side control circuit 206 which controls the gate voltage of the MOSFET 106, a bootstrap circuit 401 connected to the high-side control circuit 201, a bootstrap circuit 403 connected to the high-side control circuit 203, a bootstrap circuit 405 connected to the high-side control circuit 205, a bootstrap compensation circuit 601 connected to the high-side control circuit 201 and the bootstrap circuit 401, a bootstrap compensation circuit 603 connected to the high-side control circuit 203 and the bootstrap circuit 403, and a bootstrap compensation circuit 605 connected to the high-side control circuit 205 and the bootstrap circuit 405.

Advantageous Effects

Hereinafter, advantageous effects of the above-described preferred embodiments will be exemplified. Note that advantageous effects based on the specific configurations exemplified in the above-described preferred embodiments will be described below; however, the configurations may be replaced by other specific configurations exemplified in the present specification within a scope in which a similar effect can be created. Further, such a replacement may be made in a plurality of preferred embodiments. In other words, the replacement can also be made in a case that components exemplified in different preferred embodiments may be combined with each other to create a similar effect.

According to the above-described preferred embodiment, the bootstrap circuit 401 includes the capacitor 1001 corresponding to the first capacitor.

The capacitor 1001 is connected between (i) the reference potential VS, which is the connection point between the MOSFET 101 and the MOSFET 102, and (ii) the high-side control circuit 201 so as to supply voltage to the high-side control circuit 201 of the high-side control circuit 201 and the low-side control circuit 202 which control driving of the MOSFET 101 corresponding to the high-side switching element and the MOSFET 102 corresponding to the low-side switching element, respectively, where the MOSFET 101 and the MOSFET 102 are totem-pole connected, in order from the high voltage side, between the power source voltage HVS corresponding to a high-voltage-side potential and a low-voltage-side potential (GND).

Further, the bootstrap compensation circuit for supplying current to the bootstrap circuit 401 includes the resistor 613, the resistor 614, the capacitor 701 corresponding to the second capacitor, and the output circuit 611.

The resistor 613 and the resistor 614 are series-connected between the floating potential HVB corresponding to the power source voltage HVS and the reference potential VS.

As for the capacitor 701, one end is connected to the divided potential extraction point VMON, which is a point between the resistor 613 and the resistor 614, and the other end is connected to the reference potential VS.

The output circuit 611 supplies current to the capacitor 1001, based on the potential of the divided potential extraction point VMON.

Since such a configuration has the capacitor 701 between the reference potential VS and the divided potential extraction point VMON, the potential of the divided potential extraction point VMON is capacitively coupled to the reference potential VS. With this arrangement, since the potential of the divided potential extraction point VMON tries to keep the potential relationship with the reference potential VS, the potential of the divided potential extraction point VMON is less likely to follow the floating potential HVB or the power source voltage HVS. As a result, even in the case that a bootstrap compensation circuit is included to supply current to the bootstrap circuit 401, it is possible to prevent or reduce decrease in the response speed.

Note that other configurations, exemplified in the present specification, other than these configurations may be appropriately omitted. That is, the above-described advantageous effects can be achieved only by these configurations. However, also in the case that at least one of the other configurations exemplified in the present specification is appropriately added to the above-described configurations, in other words, also in the case that another configuration, which is exemplified in the present specification but is not described as the above-described configurations, is added to the above-described configurations, the above-described advantageous effects can be achieved.

Further, according to the above-described preferred embodiment, the bootstrap compensation circuit includes the diode 801, whose cathode is connected to the floating potential HVB and whose anode is connected to the divided potential extraction point VMON.

With such a configuration, since the diode 801 gets forward biased when the potential of the divided potential extraction point VMON becomes higher than the floating potential HVB, the divided potential extraction point VMON is clamped to the potential higher than the floating potential HVB by the forward voltage of the diode 801. As a result, it is possible to prevent a positive high voltage from being input to the gate input of the AND circuit 612.

Further, according to the above-described preferred embodiment, the bootstrap compensation circuit includes the Zener diode 802, whose cathode is connected to the floating potential HVB and whose anode is connected to the divided potential extraction point VMON.

With such a configuration, it is possible to prevent a positive high voltage from being input to the gate input of the AND circuit 612.

Further, when the potential difference between the floating potential HVB and the reference potential VS increases and the potential of the divided potential extraction point VMON is thus about to excessively decrease, the Zener diode 802 gets into a breakdown state, so that the potential of the divided potential extraction point VMON can be prevented from excessively decreasing.

Further, according to the above-described preferred embodiment, the power module includes the above-described bootstrap compensation circuit, the MOSFET 101, the MOSFET 102, the high-side control circuit 201, the low-side control circuit 202, and the bootstrap circuit 401.

With such a configuration, the number of insulated power sources can be reduced by employing bootstrap circuits while the conventional system needs an insulated power source for each of the high-side control circuits. For example, in the case of a single-phase inverter, conventionally necessary three insulated power sources can be reduced to two insulated power sources. Further, for example, in the case of a three-phase inverter, conventionally necessary four insulated power sources can be reduced to two insulated power sources.

As a result, the power source circuit can be downsized. Further, manufacturing cost can be reduced due to reduction in the number of components.

Further, according to the above-described preferred embodiment, the bootstrap circuit 401 includes the capacitor 1001.

The capacitor 1001 is connected between (i) the reference potential VS, which is the connection point between the MOSFET 101 and the MOSFET 102, and (ii) the high-side control circuit 201 so as to supply voltage to the high-side control circuit 201 of the high-side control circuit 201 and the low-side control circuit 202 which control driving of the MOSFET 101 corresponding to the high-side switching element and the MOSFET 102 corresponding to the low-side switching element, respectively, where the MOSFET 101 and the MOSFET 102 are totem-pole connected, in order from the high voltage side, between the power source voltage HVS corresponding to the high-voltage-side potential and the low-voltage-side potential (GND).

Further, the bootstrap compensation circuit for supplying current to the bootstrap circuit 401 includes the resistor 613 corresponding to the first resistor, the resistor 614 corresponding to the first resistor, the MOSFET 702 corresponding to the first MOSFET, and the output circuit 611.

The resistor 613 and the resistor 614 are series-connected between the floating potential HVB corresponding to the power source voltage HVS and the reference potential VS.

As for the MOSFET 702, the drain is connected to the divided potential extraction point VMON, which is a point between the resistor 613 and the resistor 614, and the source and the gate are connected to the reference potential VS.

The output circuit 611 supplies current to the capacitor 1001, based on the potential of the divided potential extraction point VMON.

With such a configuration, it is possible to divert, as a capacitor, a structure formed as an element having a high source-drain breakdown voltage. Therefore, the structure can be applied to elements in an IC without adding a process or the like even in the case that a high voltage such as 600 V or 1200 V is applied.

Note that other configurations, exemplified in the present specification, other than these configurations may be appropriately omitted. That is, the above-described advantageous effects can be achieved only by these configurations. However, also in the case that at least one of the other configurations exemplified in the present specification is appropriately added to the above-described configurations, in other words, also in the case that another configuration, which is exemplified in the present specification but is not described as the above-described configurations, is added to the above-described configurations, the above-described advantageous effects can be achieved.

Further, according to the above-described preferred embodiment, the bootstrap compensation circuit includes the resistor 615 corresponding to the second resistor, the MOSFET 705 corresponding to the second MOSFET, and the MOSFET 706 corresponding to the third MOSFET.

One end of the resistor 615 is connected to the floating potential HVB. The drain of the MOSFET 705 is connected to the other end of the resistor 615. As for the MOSFET 706, the drain is connected to the source of the MOSFET 705, and the source is connected to the reference potential VS.

Here, the gate of the MOSFET 704, the gate of the MOSFET 705, and the gate of the MOSFET 706 are connected to one another. Further, the gate of the MOSFET 705 and the source of the MOSFET 705 are connected to each other.

With such a configuration, if a current ratio of the resistive voltage divider circuit to the transient response detection circuit is set large, a larger current can be drawn from the divided potential extraction point VMON. As a result, it is possible to prevent or reduce increase in the circuit size.

Further, the current ratio of the resistive voltage divider circuit to the transient response detection circuit can be set large, and a current can be drawn from the divided potential extraction point VMON by using a small-sized n-type MOSFET. Further, since the MOSFET 704 is used in combination with the transient response circuit having a high-speed response, it is possible to compensate for a disadvantage that the transient response signal Vdvdt output from the transient response circuit does not last long, and in addition, it is also possible to increase the switching speed.

Modified Example

In the above-described preferred embodiments, the description is made on, in some cases, sizes, shapes, and relative positional relationships of the structural elements or practice conditions; however, these are only examples in every aspect, and the present invention is not limited to the disclosure described in the present specification. Therefore, numerous non-exemplified modified examples can be considered within the technical scope disclosed in the present specification. For example, the technical scope disclosed in the present specification includes the case that at least one structural element is deformed, added, or removed, and further includes the case that at least one structural element is picked up and is combined with a structural element in another preferred embodiment.

Further, in the above-described preferred embodiment, some structural elements are described in a singular form; however, one or more such structural elements may be included, unless inconsistent with the context. Further, each structural element is a conceptual unit, and the technical scope disclosed in the present specification includes the case that one structural element is constituted by a plurality of structures, the case that a single structural element corresponds to part of a structure, and the case that a plurality of structural elements are included in a single structure. Further, each structural element includes a structure having another configuration or shape as long as the same function is performed.

Further, the descriptions in the present specification are referenced for every purpose relating to the present technology, and any of the descriptions is not deemed to be a conventional art.

While the invention has been shown and described in detail, the foregoing description is in all aspects illustrative and not restrictive. It is therefore understood that numerous modifications and variations can be devised without departing from the scope of the invention.

What is claimed is:

1. A bootstrap compensation circuit which supplies current to a bootstrap circuit, said bootstrap circuit including a first capacitor connected between a reference potential, which is a connection point between a high-side switching element and a low-side switching element, and each of a high-side control circuit and a low-side control circuit, respectively, where the switching elements are totem-pole connected between a high-voltage-side potential and a low-voltage-side potential, said bootstrap compensation circuit comprising:
   a plurality of resistors series-connected between a floating potential corresponding to said high-voltage-side potential and said reference potential;
   a second capacitor, one end of which is connected to a divided potential extraction point and the other end of which is connected to said reference potential, the divided potential extraction point being a point between said plurality of resistors; and
   an output circuit which supplies current to said first capacitor, based on a potential of said divided potential extraction point.

2. The bootstrap compensation circuit according to claim 1, further comprising a diode whose cathode is connected to said floating potential and whose anode is connected to said divided potential extraction point.

3. The bootstrap compensation circuit according to claim 1, further comprising a Zener diode whose cathode is connected to said floating potential and whose anode is connected to said divided potential extraction point.

4. A power module comprising:
   the bootstrap compensation circuit according to claim 1;
   said high-side switching element;
   said low-side switching element;
   said high-side control circuit;
   said low-side control circuit; and
   said bootstrap circuit.

5. A bootstrap compensation circuit which supplies current to a bootstrap circuit, said bootstrap circuit including a capacitor connected between a reference potential, which is a connection point between a high-side switching element and a low-side switching element, and each of a high-side control circuit and a low-side control circuit, respectively, where the switching elements are totem-pole connected between a high-voltage-side potential and a low-voltage-side potential, said bootstrap compensation circuit comprising:
   a plurality of first resistors series-connected between a floating potential corresponding to said high-voltage-side potential and said reference potential;
   a first MOSFET whose drain is connected to a divided potential extraction point and whose source and gate are connected to said reference potential, the divided potential extraction point being a point between said plurality of first resistors; and
   an output circuit which supplies current to said capacitor, based on a potential of said divided potential extraction point.

6. The bootstrap compensation circuit according to claim 5, further comprising:
   a second resistor, one end of which is connected to said floating potential;
   a second MOSFET whose drain is connected to the other end of said second resistor; and
   a third MOSFET whose drain is connected to a source of said second MOSFET and whose source is connected to said reference potential,
   wherein the gate of said first MOSFET, a gate of said second MOSFET, and a gate of said third MOSFET are connected to one another, and
   the gate of said second MOSFET and a source of said second MOSFET are connected to each other.

7. The bootstrap compensation circuit according to claim 5, further comprising a diode whose cathode is connected to said floating potential and whose anode is connected to said divided potential extraction point.

8. The bootstrap compensation circuit according to claim 5, further comprising a Zener diode whose cathode is connected to said floating potential and whose anode is connected to said divided potential extraction point.

9. A power module comprising:
the bootstrap compensation circuit according to claim 5;
said high-side switching element;
said low-side switching element;
said high-side control circuit;
said low-side control circuit; and
said bootstrap circuit.

* * * * *